(12) United States Patent
Kim

(10) Patent No.: US 11,538,826 B2
(45) Date of Patent: Dec. 27, 2022

(54) SEMICONDUCTOR DEVICE WITH IMPROVED WORD LINE RESISTANCE

(71) Applicant: SK hynix Inc., Icheon-si (KR)

(72) Inventor: Jinha Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/897,009

(22) Filed: Jun. 9, 2020

(65) Prior Publication Data
US 2021/0183884 A1 Jun. 17, 2021

(30) Foreign Application Priority Data

Dec. 13, 2019 (KR) .................. 10-2019-0167067

(51) Int. Cl.
*H01L 27/11582* (2017.01)
*H01L 27/1157* (2017.01)
*H01L 27/11565* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ........................................ H01L 27/115–11597
See application file for complete search history.

(56) References Cited

U.S. PATENT DOCUMENTS

| | | | |
|---|---|---|---|
| 9,355,727 B1* | 5/2016 | Zhang | G11C 16/26 |
| 9,601,508 B2 | 3/2017 | Sel et al. | |
| 2010/0237504 A1* | 9/2010 | Hong | H01L 27/11524 257/758 |
| 2010/0314679 A1* | 12/2010 | Lee | H01L 29/40114 257/324 |
| 2016/0315095 A1* | 10/2016 | Sel | H01L 21/31111 |
| 2017/0098659 A1* | 4/2017 | Yoshimizu | H01L 27/11582 |
| 2017/0287925 A9* | 10/2017 | Makala | H01L 27/11556 |
| 2019/0088675 A1* | 3/2019 | Itokawa | H01L 29/517 |

* cited by examiner

*Primary Examiner* — Didarul A Mazumder
*Assistant Examiner* — Gustavo G Ramallo
(74) *Attorney, Agent, or Firm* — William Park & Associates Ltd.

(57) ABSTRACT

A semiconductor device includes: an alternating stack of conductive layers and dielectric layers disposed over a substrate; a channel layer disposed in a through portion, penetrating through the alternating stack; a blocking layer disposed in the through portion, surrounding an outer wall of the channel layer; and a continuous etch stop layer disposed in the through portion, surrounding an outer wall of the blocking layer.

13 Claims, 20 Drawing Sheets

SEMICONDUCTOR DEVICE WITH IMPROVED WORD LINE RESISTANCE

CROSS-REFERENCE TO RELATED APPLICATIONS

The present application claims priority of Korean Patent Application No. 10-2019-0167067, filed on Dec. 13, 2019, which is incorporated herein by reference in its entirety.

BACKGROUND

1. Field

Exemplary embodiments of the present invention relate to an electronic device, and more particularly, to a semiconductor device, and a method for fabricating a semiconductor device.

2. Description of the Related Art

A semiconductor device in which memory cells are integrated in three dimensions is proposed. Semiconductor devices require improved reliability.

SUMMARY

In accordance with an embodiment of the present invention, a semiconductor device includes: an alternating stack of conductive layers and dielectric layers disposed over a substrate; a channel layer disposed in a through portion, penetrating through the alternating stack; a blocking layer disposed in the through portion, surrounding an outer wall of the channel layer; and a continuous etch stop layer disposed in the through portion, surrounding an outer wall of the blocking layer.

In accordance with another embodiment of the present invention, a method for fabricating a semiconductor device includes: forming an alternating stack of sacrificial layers and dielectric layers over a substrate; forming a first through portion penetrating through the alternating stack; forming an etch stop layer to cover a sidewall of the first through portion; forming a blocking layer disposed in the first through portion over the etch stop layer; forming a second through portion by etching a portion of the alternating stack; removing the sacrificial layers through the second through portion to form an air gap between the dielectric layers; and forming conductive layers in place of the sacrificial layers, wherein the conductive layers are in contact with the etch stop layer while filling the air gaps.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1A:
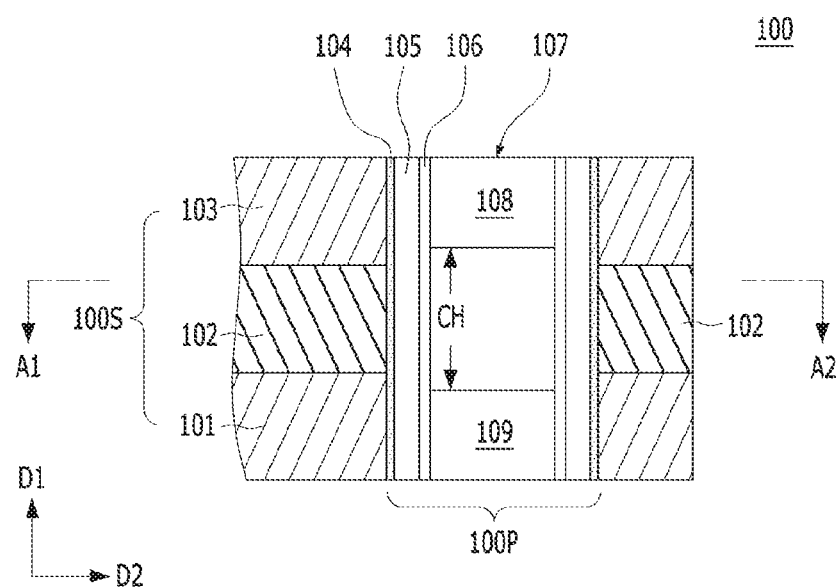
Figure 1B:
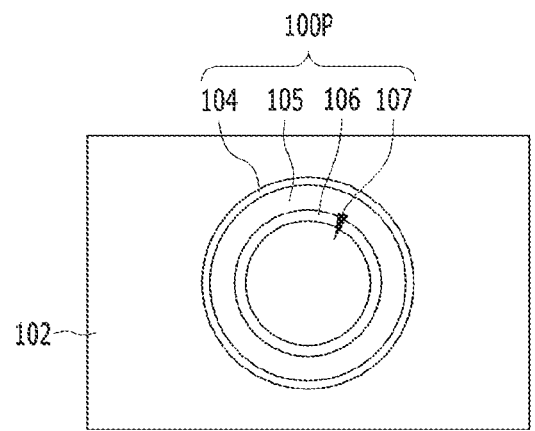

FIGS. 1A and 1B illustrate a semiconductor device in accordance with an embodiment of the present invention.

FIGS. 2A to 2H are cross-sectional views, illustrating an example of a method for fabricating a semiconductor device, in accordance with an embodiment of the present invention.

Figure 3A:
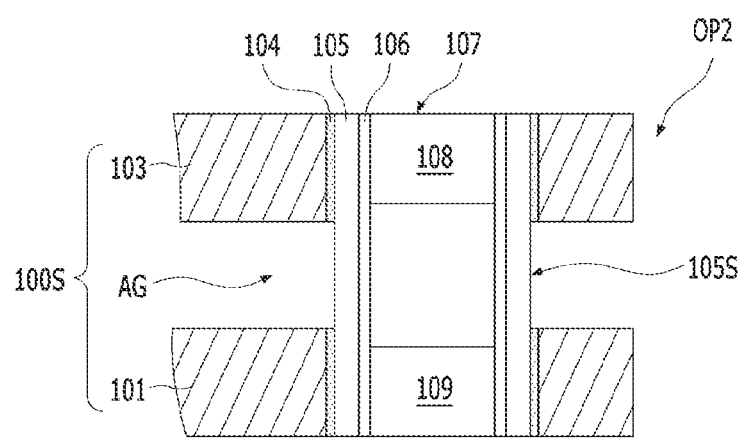
Figure 3B:
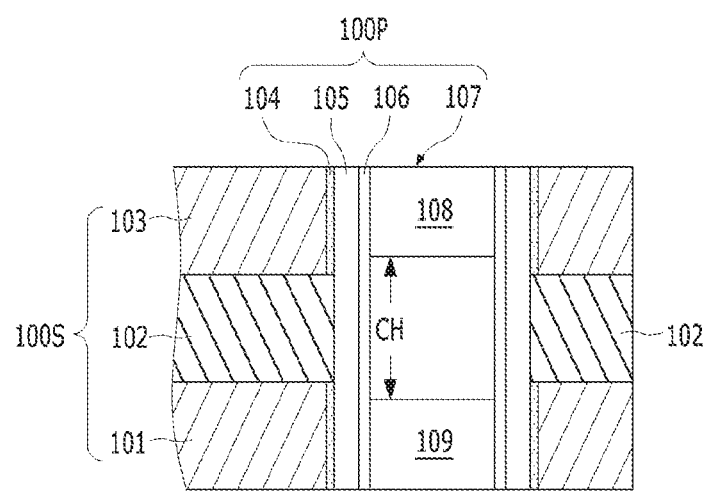

FIGS. 3A and 3B are cross-sectional views, illustrating an example of a method for fabricating a semiconductor device, in accordance with another embodiment of the present invention.

Figure 4A:
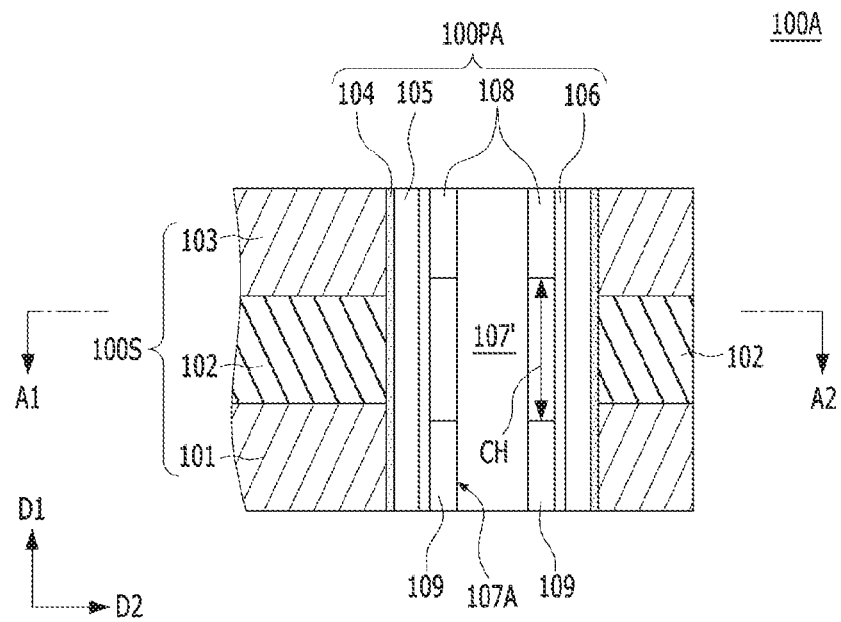
Figure 4B:
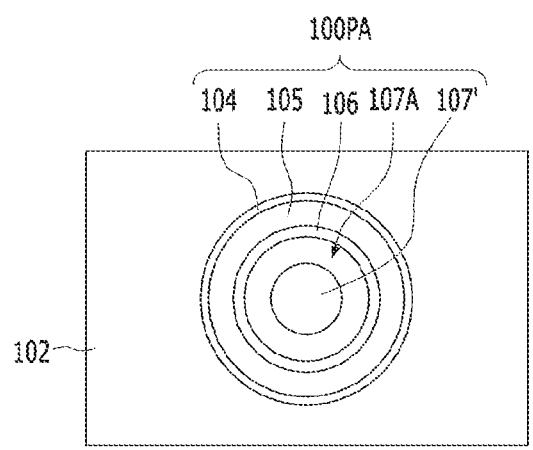

FIGS. 4A and 4B illustrate a semiconductor device according to a modified example of FIG. 1A.

Figure 5A:
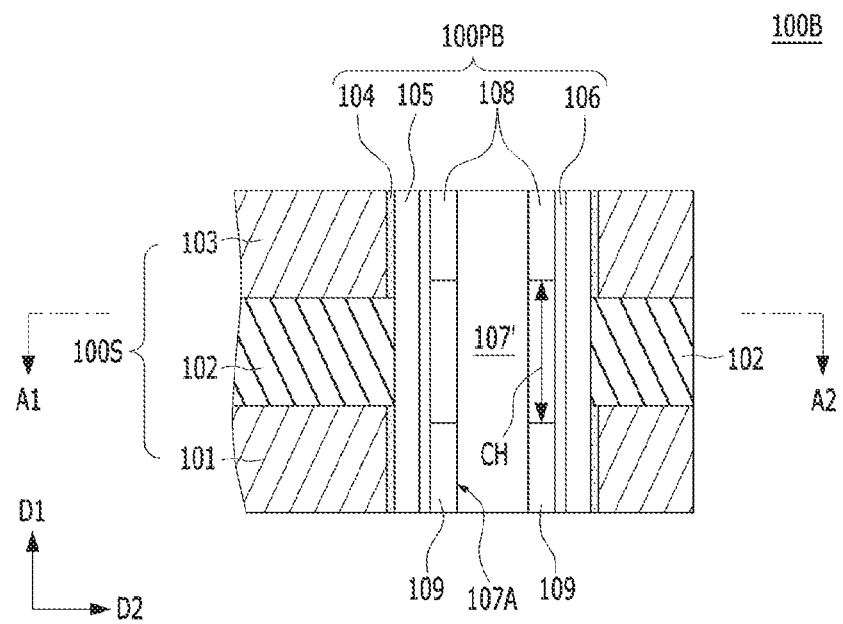
Figure 5B:
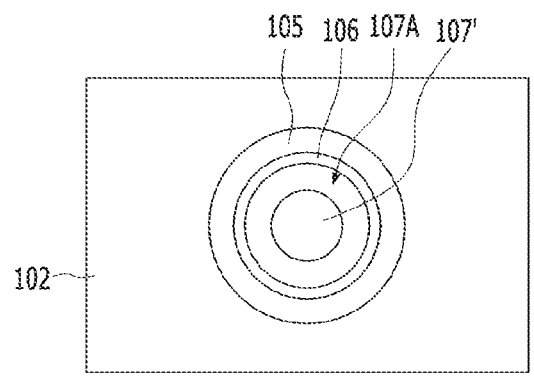

FIGS. 5A and 5B illustrate a semiconductor device according to a modified example of FIG. 4A.

Figure 6A:
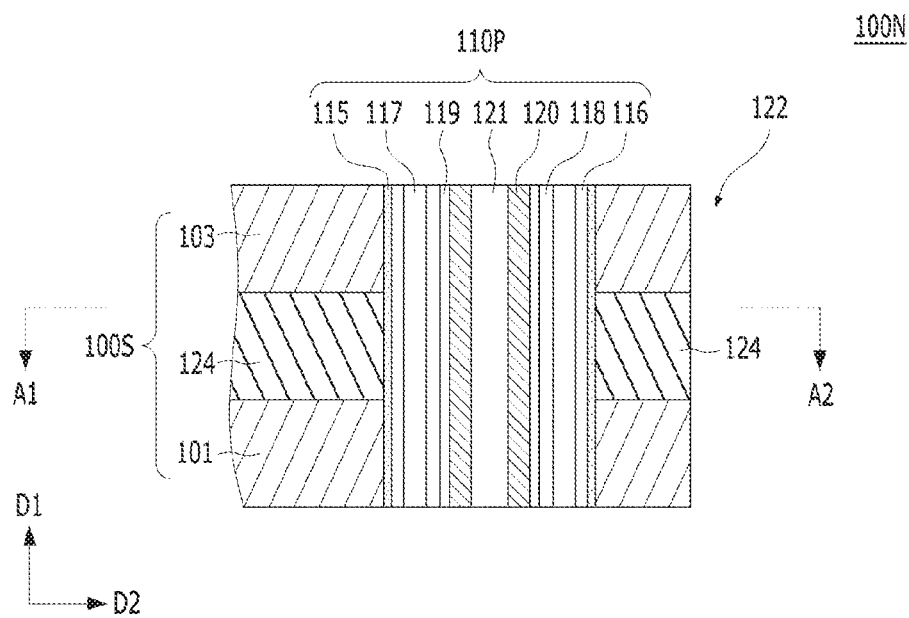
Figure 6B:
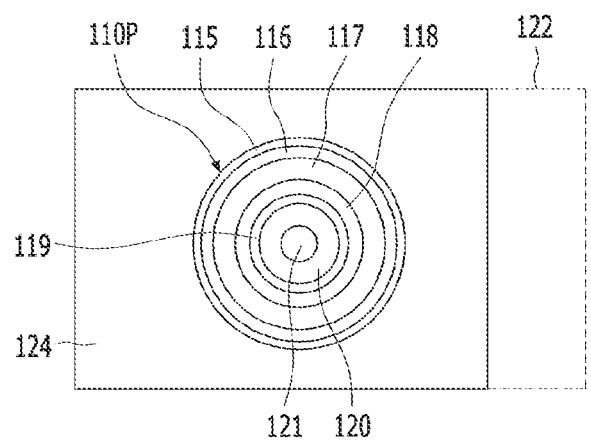

FIGS. 6A and 6B illustrate a semiconductor device in accordance with another embodiment of the present invention.

FIGS. 7A to 7H are cross-sectional views, illustrating an example of a method for fabricating a semiconductor device, in accordance with another embodiment of the present invention.

Figure 8A:
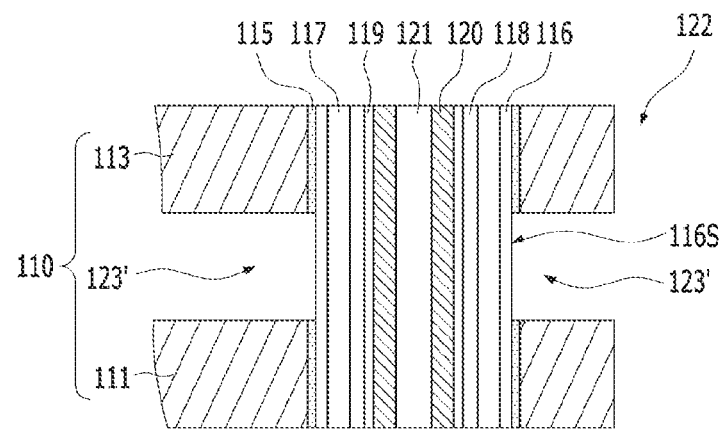
Figure 8B:
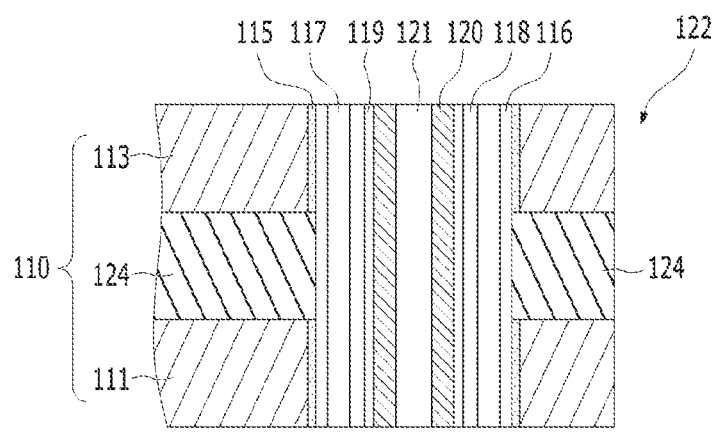

FIGS. 8A and 8B are cross-sectional views, illustrating an example of a method for fabricating a semiconductor device, in accordance with another embodiment of the present invention.

Figure 9A:
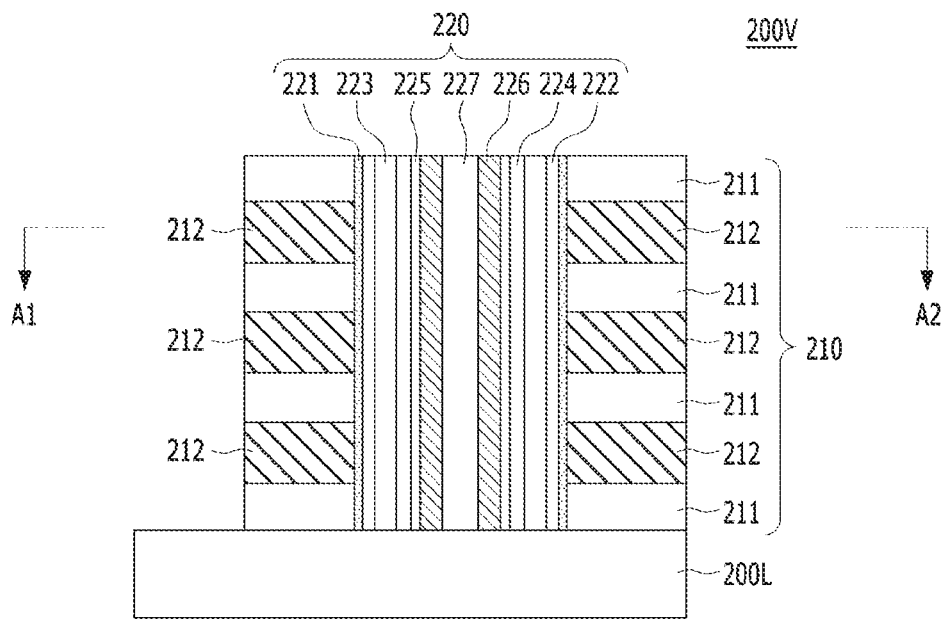
Figure 9B:
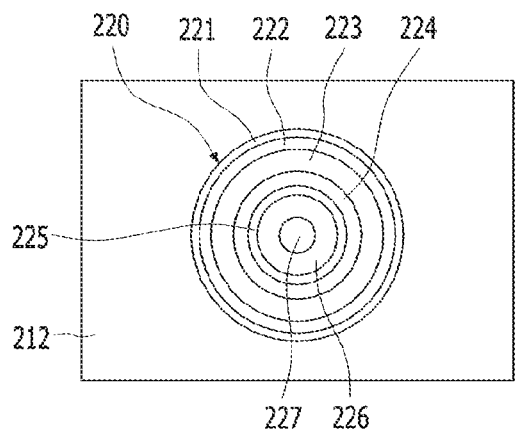

FIGS. 9A and 9B illustrate a semiconductor device in accordance with another embodiment of the present invention.

FIGS. 10A to 10H are cross-sectional views, illustrating an example of a method for fabricating a semiconductor device, in accordance with another embodiment of the present invention.

Figure 11A:
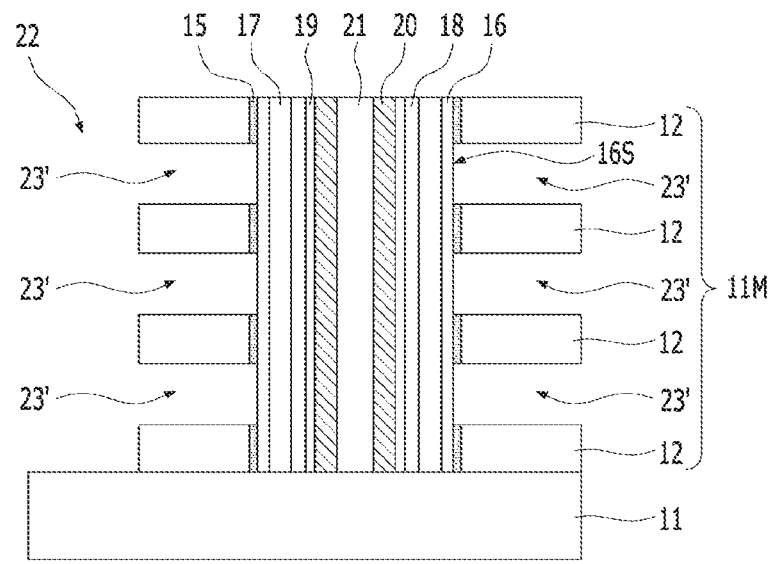
Figure 11B:
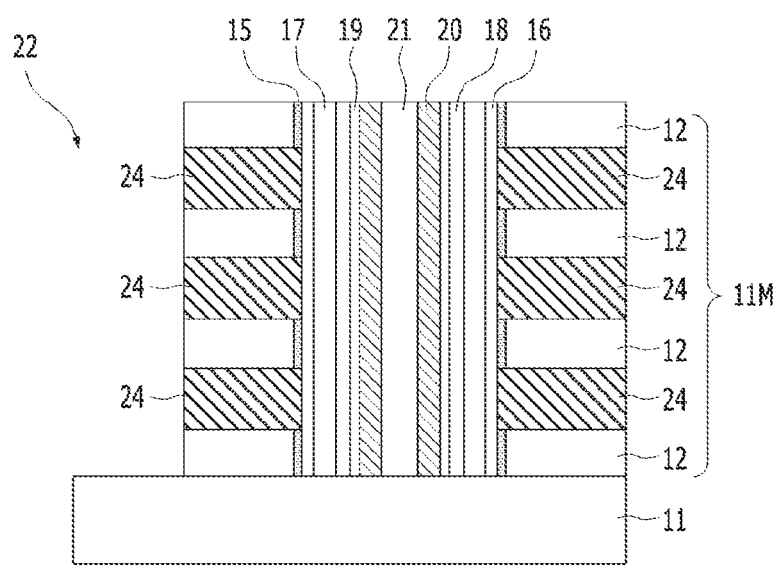

FIGS. 11A and 11B are cross-sectional views, illustrating an example of a method for fabricating a semiconductor device, in accordance with another embodiment of the present invention.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Embodiments of the present invention are directed to a semiconductor device with improved reliability, and a method for fabricating the semiconductor device.

FIGS. 1A and 1B illustrate a semiconductor device 100 in accordance with an embodiment of the present invention. FIG. 1B is a plan view according to a line A1-A2 of FIG. 1A.

Referring to FIGS. 1A and 1B, the semiconductor device 100 may include a stack body 100S and a pillar structure 100P that penetrates through the stack body 100S in a substantially vertical manner.

The stack body 100S may include a first layer 101, a second layer 103, and a conductive layer 102, the conductive layer 102 being formed between the first layer 101 and the second layer 103. For example, the first layer 101 may be formed over a substrate or another layer (not shown). The conductive layer 102 may be formed over the first layer 101, and the second layer 103 may be formed over the conductive layer 102. The conductive layer 102 may be disposed between the first layer 101 and the second layer 103. The first layer 101, the conductive layer 102, and the second layer 103 may be stacked vertically along a first direction D1. The conductive layer 102 may include a material that is different from the first layer 101 and the second layer 103, and the first layer 101 and the second layer 103 may be of the same material or of different materials. The first layer 101 and the second layer 103 may include a dielectric material. The first layer 101 and the second layer 103 may include silicon oxide, silicon nitride, or a combination thereof. The first layer 101 and the second layer 103 may have the same thickness. The first layer 101, the conductive layer 102, and the second layer 103 may have the same thickness. According to another embodiment of the present invention, the conductive layer 102 may be thicker than the first layer 101 and the third layer 103. The conductive layer 102 may include polysilicon, a metal, a metal nitride, a metal silicide, or a combination thereof. The conductive layer 102 may include titanium nitride, tungsten or a stack of titanium nitride and tungsten (TiN/W). The conductive layer 102 may be shaped to surround the sidewall of the pillar structure 100P. The conductive layer 102 may have a planar shape that is parallel to a second direction D2.

The pillar structure 100P may extend vertically along the first direction D1. The pillar structure 100P may be referred to as a vertical pillar structure. The pillar structure 100P may include an etch stop layer 104, a high dielectric layer 105, an interface layer 106, and an active layer 107. The active layer 107 may include a first doped region 108 and a second doped region 109. A vertical channel CH may be formed between the first doped region 108 and the second doped region 109. The first doped region 108 and the second doped region 109 may be referred to as the source and drain regions.

The etch stop layer 104 may be thinner than the first layer 101, the conductive layer 102, and the second layer 103. The etch stop layer 104 may include a material that is different from that of the conductive layer 102. The etch stop layer 104 may include a material that is different from those of the first layer 101 and the second layer 103. The etch stop layer 104 may include a dielectric material. In other words, the etch stop layer 104 may include a carbon-containing material, and the first layer 101 and the second layer 103 may include carbon-free materials. The first layer 101 and the second layer 103 may be carbon-free silicon oxide, and the etch stop layer 104 may be carbon-containing silicon oxide. For example, the first layer 101 and the second layer 103 may be $SiO_2$, and the etch stop layer 104 may be SiCO. SiCO may be more etch-resistant than $SiO_2$.

The high dielectric layer 105 may include a material that is different from that of the etch stop layer 104. The high dielectric layer 105 may include a metal-containing material. The high dielectric layer 105 may include a metal oxide. The high dielectric layer 105 may have a higher dielectric constant than the etch stop layer 104. The high dielectric layer 105 may include a high-k material. For example, the high dielectric layer 105 may include aluminum oxide, hafnium oxide, zirconium oxide, or a combination thereof. The high dielectric layer 105 may be thicker than the etch stop layer 104.

The interface layer 106 may include a low-k material. The interface layer 106 may include a material that is different from those of the etch stop layer 104 and the high dielectric layer 105. The interface layer 106 may include silicon oxide and may be free of carbon.

The active layer 107 may include a semiconductor material. For example, the active layer 107 may include one among a polycrystalline semiconductor material, an amorphous semiconductor material, and a monocrystalline semiconductor material. The active layer 107 may include silicon (Si), germanium (Ge), silicon germanium (SiGe), a group III-V compound, or a group II-VI compound. The active layer 107 may include polysilicon. The first doped region 108 and the second doped region 109 may be formed in the active layer 107. The first doped region 108 and the second doped region 109 may be regions that are doped with a conductive dopant. For example, the conductive dopant may include phosphorus (P), arsenic (As), antimony (Sb), or boron (B). The first doped region 108 and the second doped region 109 may be doped with dopants of the same conductivity type.

Referring to FIGS. 1A and 1B, the semiconductor device 100 may be a transistor, and the conductive layer 102 may be a gate electrode. As will be described later, the conductive layer 102 may be formed by replacing the sacrificial layer with a conductive material. During the process of replacing the sacrificial layer with a conductive layer 102, the etch stop layer 104 may protect the high dielectric layer 105.

FIGS. 2A to 2H are cross-sectional views, illustrating an example of a method for fabricating a semiconductor device, in accordance with an embodiment of the present invention.

Figure 2A:
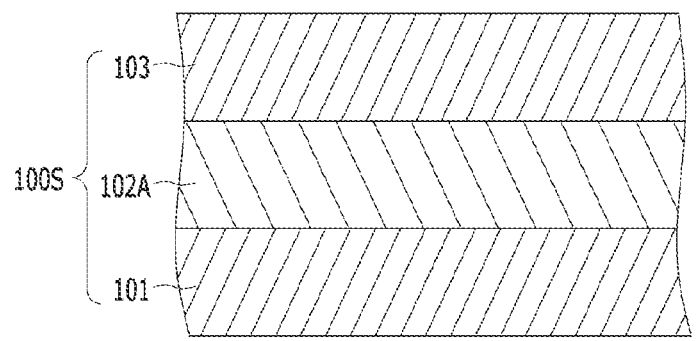

Referring to FIG. 2A, a stacked body 100S may be prepared. The stack body 100S may include a first layer 101, a second layer 103, and a sacrificial layer 102A, the sacrificial layer 102A being formed between the first layer 101 and the second layer 103.

For example, the first layer 101 may be formed over a substrate or another layer (not shown). The sacrificial layer 102A may be formed over the first layer 101, and the second layer 103 may be formed over the sacrificial layer 102A. The sacrificial layer 102A may be located between the first layer 101 and the second layer 103.

The sacrificial layer 102A may include a material that is different from those of the first layer 101 and the second layer 103. Furthermore, the etching selectivity of the sacrificial layer 102A, with respect to the first layer 101 and the second layer 103, may be sufficiently large. The first layer 101 and the second layer 103 may be of the same material or different materials.

The first layer 101 and the second layer 103 may include silicon oxide, and the sacrificial layer 102A may include silicon nitride, a metal material, or polysilicon. The first layer 101 and the second layer 103 may include silicon nitride, and the sacrificial layer 102A may include silicon oxide.

Figure 2B:
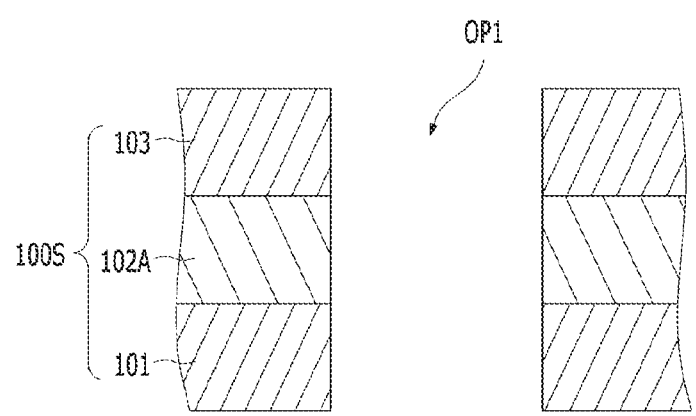

Referring to FIG. 2B, a first through portion OP1 may be formed in the stack body 100S. The first through portion OP1 may be, for example, a hole or a slit that is formed through an anisotropic etching process, such as reactive ion etching (RIE). The first through portion OP1 may be referred to as an opening.

The first through portion OP1 may penetrate through the second layer 103, the sacrificial layer 102A, and the first layer 101 in a substantially vertical manner. The sidewall of the first through portion OP1 may be formed by etching the surface of the first layer 101, the sacrificial layer 102A, and the second layer 103.

Figure 2C:
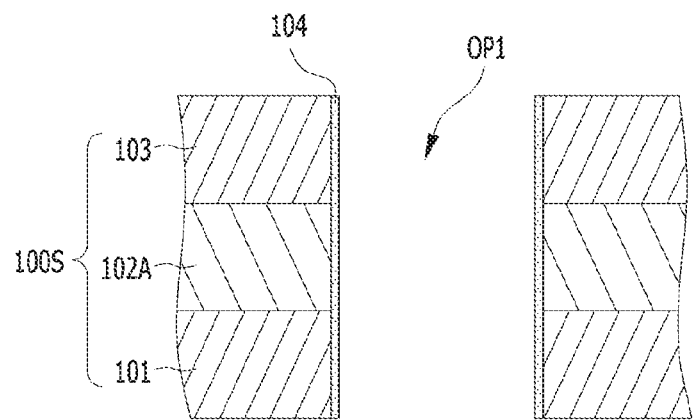

Referring to FIG. 2C, an etch stop layer 104 may be formed to cover the sidewall of the first through portion OP1. The etch stop layer 104 may be formed to cover the sidewall of the first through portion OP1. The etch stop layer 104 may be thinner than the first layer 101, the sacrificial layer 102A, and the second layer 103. The etch stop layer 104 may include a material that is different from that of the sacrificial layer 102A. Furthermore, the etching selectivity of the etch stop layer 104, with respect to the sacrificial layer 102A, may be sufficiently large. The etch stop layer 104 may include a material that is different from those of the first layer 101 and the second layer 103. The etch stop layer 104 may include a carbon-containing material, and the first layer 101 and the second layer 103 may include carbon-free materials. The first layer 101 and the second layer 103 may be carbon-free silicon oxide, and the etch stop layer 104 may be carbon-containing silicon oxide. For example, the first layer 101 and the second layer 103 may include $SiO_2$, and the etch stop layer 104 may include SiCO. During the subsequent process of etching the sacrificial layer 102A, SiCO may have a greater etch resistance than $SiO_2$.

Figure 2D:
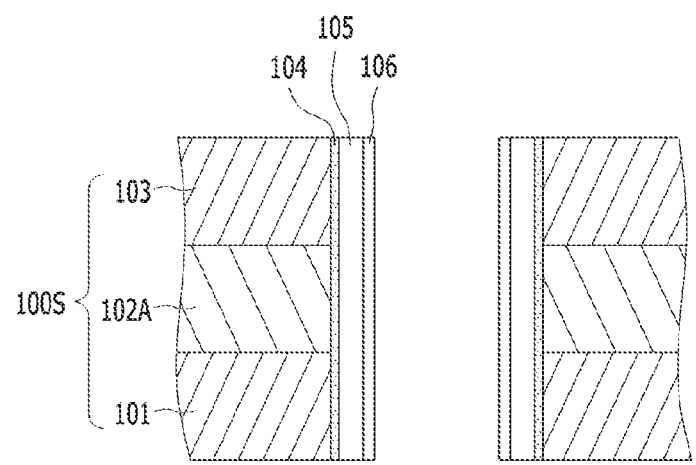

Referring to FIG. 2D, a high dielectric layer 105 may be formed over the etch stop layer 104. The high dielectric layer 105 may include a material that is different from that of the etch stop layer 104. The high dielectric layer 105 may include a metal-containing material. The high dielectric layer 105 may include a metal oxide. The high dielectric layer 105 may have a higher dielectric constant than the etch stop layer 104. The high dielectric layer 105 may include a high-k material. For example, the high dielectric layer 105 may include aluminum oxide, hafnium oxide, zirconium oxide, or a combination thereof. The high dielectric layer 105 may be thicker than the etch stop layer 104.

An Interface layer 106 may be formed over the high dielectric layer 105. The interface layer 106 may include a material that is different from that of the high dielectric layer 105. The interface layer 106 may be thicker than the high dielectric layer 105. The interface layer 106 may have a smaller dielectric constant than the high dielectric layer 105. The interface layer 106 may include a low-k material. The interface layer 106 may include a material that is different from that of the etch stop layer 104. The interface layer 106 may include silicon oxide or silicon oxynitride, and the interface layer 106 may be free of carbon.

Figure 2E:
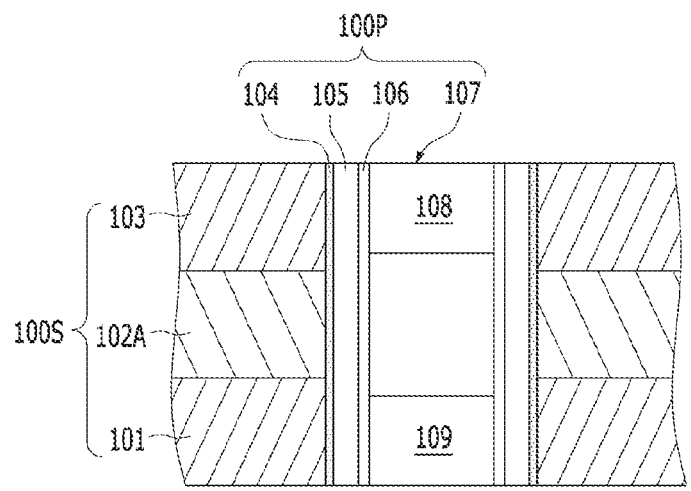

Referring to FIG. 2E, an active layer 107 may be formed over the interface layer 106. The active layer 107 may include a semiconductor material. For example, the active layer 107 may include one of a polycrystalline semiconductor material, an amorphous semiconductor material, and a monocrystalline semiconductor material. The active layer 107 may include silicon (Si), germanium (Ge), silicon germanium (SiGe), a group III-V compound, or a group II-VI compound. The active layer 107 may include polysilicon. The active layer 107 may fill a first through portion OP1. The active layer 107 may include a first doped region 108 and a second doped region 109.

The first through portion OP1 may be filled with a pillar structure 100P. The pillar structure 100P may include an etch stop layer 104, a high dielectric layer 105, an interface layer 106, and an active layer 107. The interface layer 106 may be shaped to enclose the active layer 107, and the high dielectric layer 105 may be shaped to enclose the interface layer 106. The etch stop layer 104 may be shaped to surround the high dielectric layer 106.

Figure 2F:
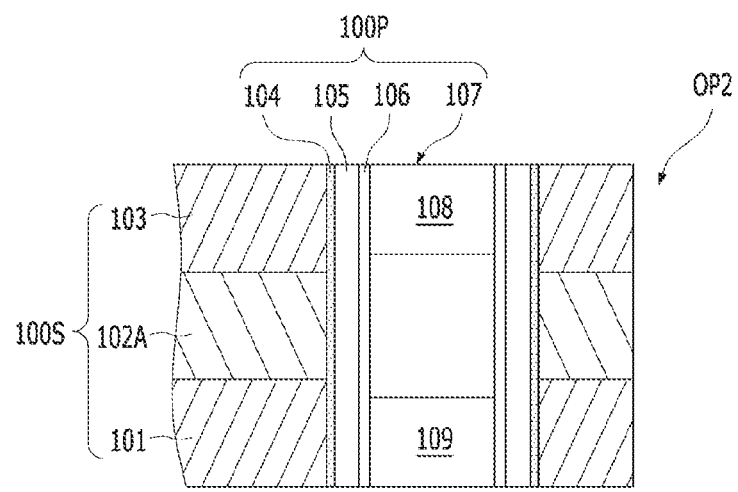

Referring to FIG. 2F, a second through portion OP2 may be formed in a portion of the stack body 100S. The second through portion OP2 may be, for example, a hole or a slit that is formed through an anisotropic etching process, such as reactive ion etching (RIE). The second through portion OP2 may be referred to as an opening. The first through portion OP1 may have a hole shape, and the second through portion OP2 may have a slit shape.

The second through portion OP2 may penetrate through the second layer 103, the sacrificial layer 102A, and the first layer 101 in a substantially vertical manner. The sidewall of the second through portion OP2 may be formed by etching the surface of the first layer 101, the sacrificial layer 102A, and the second layer 103.

Figure 2G:
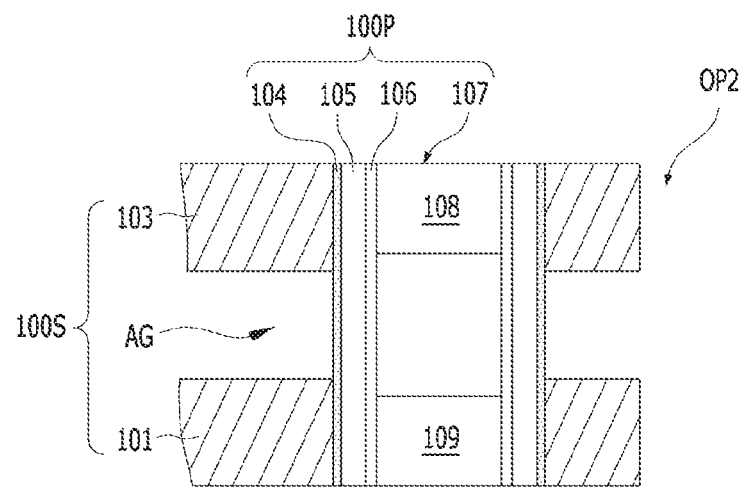
Figure 2H:
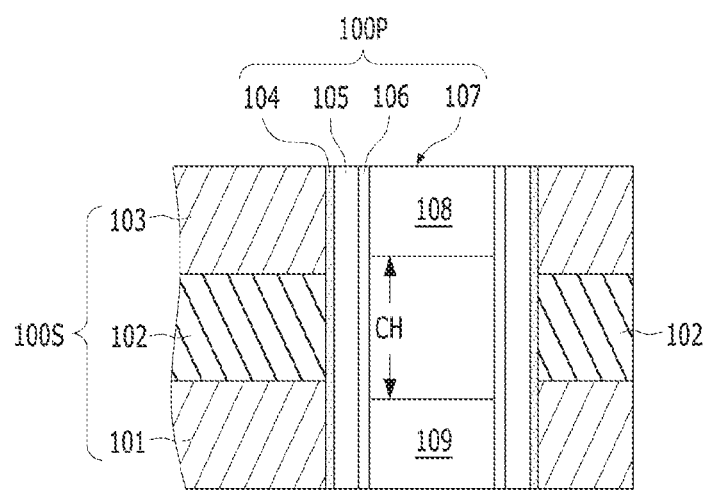

FIGS. 2G and 2H illustrate a series of processes for replacing the sacrificial layer 102A with the conductive layer 102.

Referring to FIG. 2G, the sacrificial layer 102A may be selectively removed. When an etchant or an etching gas is supplied to the second through portion OP2, the sacrificial layer 102A may be selectively etched. For example, when the sacrificial layer 102A is silicon oxide, the silicon oxide may be etched by supplying an etchant with hydrofluoric acid to the second through portion OP2. The first layer 101 and the second layer 103 may include, for example, silicon nitride or a metal material. The metal material and silicon nitride may have an etch resistance to an etchant with hydrofluoric acid.

According to another embodiment of the present invention, when the sacrificial layer 102A is silicon nitride, silicon nitride may be etched by supplying an etchant with phosphoric acid to the second through portion OP2. The first layer 101 and the second layer 103 may be, for example, silicon oxide, and the silicon oxide may have an etch resistance to an etchant with phosphoric acid.

The etching of the sacrificial layer 102A may proceed from an end surface of the sacrificial layer 102A that is exposed through the second through portion OP2. The end surface of the sacrificial layer 102A may be recessed in a diametral direction or a width direction through the second through portion OP2.

By etching the sacrificial layer 102A, an air gap AG, continuous from the second through portion OP2, may be formed between the first layer 101 and the second layer 103. The sacrificial layer 102A might not remain between the first layer 101 and the second layer 103. For example, all of the sacrificial layer 102A may be removed, and as a result, the etch stop layer 104 may be exposed. The air gap AG may be formed between the second through portion OP2 and the etch stop layer 104. The etch stop layer 104 may control the end point of the etching process for the sacrificial layer 102A. The etching process of the sacrificial layer 102A may include a dip-out process.

As described above, the etch stop layer 104 may protect the high dielectric layer 105 while the sacrificial layer 102A is etched.

According to another embodiment of the present invention, after the sacrificial layer 102A is removed, a process to convert the etch stop layer 104 may be performed. The converting process may expose the etch stop layer 104 to a plasma treatment or a thermal treatment. The etch stop layer 104 may be converted to a carbon-free material through the converting process. For example, SiCO may be converted to $SiO_2$.

Referring to FIG. 2H, a conductive layer 102 may be formed. The conductive layer 102 may include polysilicon, a metal, a metal nitride, a metal silicide, or a combination thereof. The conductive layer 102 may include titanium nitride, tungsten, or a stack of titanium nitride and tungsten. The conductive layer 102 may be formed in the air gap AG. The conductive layer 102 may be formed by depositing a conductive material to fill the air gap AG and then by performing an etch-back process on the conductive material. The conductive layer 102 may be disposed between the first layer 101 and the second layer 103. The conductive layer 102 may serve as a gate electrode.

The conductive layer 102 may fully fill the air gap AG, while not overflowing into the second through portion OP2. The conductive layer 102 may be in direct contact with the etch stop layer 104.

As described above, since the air gap AG is filled only with the conductive layer 102, the gap-fill characteristic of the conductive layer 102 may be improved. No material, other than the conductive layer 102, may be formed in the air gap AG. For example, the etch stop layer 104, the high dielectric layer 105, and the interface layer 106 might not be formed in the air gap AG. Accordingly, the volume of the conductive layer 102, filling the air gap AG, may be increased.

A multi-layered stack may be formed between the active layer 107 and the conductive layer 102. The multi-layered stack may include an etch stop layer 104, a high dielectric layer 105, and an interface layer 106. The conductive layer 102 may be a ring type, the hole being formed by surrounding the pillar structure 100P. When the conductive layer 102 includes a metal material, a transistor with a vertical channel high-k metal gate (HKMG) structure may be formed. The vertical channel CH may be formed in a substantially vertical manner in the active layer 107 between the first doped region 108 and the second doped region 109.

FIGS. 3A and 3B are cross-sectional views, illustrating an example of a method for fabricating a semiconductor device, in accordance with another embodiment of the present invention.

First of all, the air gap AG may be formed through a series of processes that are illustrated in FIGS. 2A to 2G.

Subsequently, as illustrated in FIG. 3A, a portion of the etch stop layer 104, exposed by the air gap AG, may be removed. As a result, some surfaces 105S of the high dielectric layer 105 may be exposed, and the air gap AG may be horizontally extended. In other words, the widened air gap AG may be formed. The air gap AG may be horizontally wider than the air gap AG of FIG. 2G.

The process for removing a portion of the etch stop layer 104 may include dry etching. According to another embodiment of the present invention, even when the etch stop layer 104 is converted to $SiO_2$, a portion of the etch stop layer 104 may be removed through a dry etching process.

Referring to FIG. 3B, a conductive layer 102 may be formed. The conductive layer 102 may include polysilicon, a metal, a metal nitride, a metal silicide, or a combination thereof. The conductive layer 102 may include titanium nitride, tungsten, or a stack of titanium nitride and tungsten. The conductive layer 102 may be formed in the air gap AG. The conductive layer 102 may be formed by depositing a conductive material to fill the air gap AG and then by performing an etch-back process on the conductive material. The conductive layer 102 may be disposed between the first layer 101 and the second layer 103. The conductive layer 102 may serve as a gate electrode.

The conductive layer 102 may fully fill the air gap AG, while not overflowing into the second through portion OP2 and. The conductive layer 102 may be in direct contact with the high dielectric layer 105.

As described above, since the air gap AG is filled only with the conductive layer 102, the gap-fill characteristic of the conductive layer 102 may be improved. No material, other than the conductive layer 102, may be formed in the air gap AG. For example, the etch stop layer 104, the high dielectric layer 105, and the interface layer 106 might not be formed in the air gap AG. Accordingly, the volume of the conductive layer 102, filling the air gap AG, may be increased.

A multi-layered stack may be formed between the active layer 107 and the conductive layer 102. The multi-layered stack may include a high dielectric layer 105 and an interface layer 106. The conductive layer 102 may be a ring type, the hole being formed by surrounding the pillar structure 100P. When the conductive layer 102 includes a metal material, a transistor with a vertical channel high-k metal gate (HKMG) structure may be formed. The vertical channel CH may be formed in a substantially vertical manner in the active layer 107 between the first doped region 108 and the second doped region 109.

The high dielectric layer 105 and the interface layer 106 may remain between the vertical channel CH and the conductive layer 102. The etch stop layer 104, the high dielectric layer 105, and the interface layer 106 may remain between the first layer 101 and the second doped region 109. The etch stop layer 104, the high dielectric layer 105, and the interface layer 106 may remain between the second layer 103 and the first doped region 108.

FIGS. 4A and 4B illustrate a semiconductor device according to a modified example of FIG. 1A. FIG. 4B is a plan view taken along a line A1-A2 of FIG. 4A. The semiconductor device 100A may be similar to the semiconductor device 100 of FIG. 1A. Hereinafter, detailed description on the constituent elements appearing in common will be omitted.

Referring to FIGS. 4A and 4B, the semiconductor device 100A may include a stack body 100S and a pillar structure 100PA penetrating through the stack body 100S.

The stack body 100S may include a first layer 101, a second layer 103, and a conductive layer 102 provided between the first layer 101 and the second layer 103. For example, the first layer 101 may be formed over a substrate or another layer that is not shown. The conductive layer 102 may be formed over the first layer 101, and the second layer 103 may be formed over the conductive layer 102. The conductive layer 102 may be disposed between the first layer 101 and the second layer 103. The first layer 101, the conductive layer 102, and the second layer 103 may be stacked vertically in the first direction D1. The conductive layer 102 may have a shape surrounding the sidewall of the pillar structure 100PA. The conductive layer 102 may have a planar shape that is parallel to the second direction D2.

The pillar structure 100PA may extend vertically in the first direction D1. The pillar structure 100PA may be referred to as a vertical pillar structure. The pillar structure 100PA may include the etch stop layer 104, the high dielectric layer 105, the interface layer 106, and the active layer 107A. The active layer 107A may include a first doped region 108 and a second doped region 109. A vertical channel CH may be defined between the first doped region 108 and the second doped region 109. The first doped region 108 and the second doped region 109 may be referred to as source and drain regions. The etch stop layer 104, the high dielectric layer 105, and the interface layer 106 may have a shape whose top and bottom are opened. The active layer 107A may have a shape whose top and bottom are opened. According to another embodiment of the present invention, the active layer 107A may be a tube shape or cylinder shape with an inner space. The inner space of the active layer 107A may be filled with a core dielectric layer 107'. The bottom surfaces of the etch stop layer 104, the high dielectric layer 105, the interface layer 106, and the active layer 107A may be positioned at the same level.

The etch stop layer 104 may continue in the first direction D1. The etch stop layer 104, the high dielectric layer 105, and the interface layer 106 may be formed between the vertical channel CH and the conductive layer 102. The etch stop layer 104, the high dielectric layer 105, and the interface layer 106 may be formed between the first layer 101 and the second doped region 109. The etch stop layer 104, the high dielectric layer 105, and the interface layer 106 may be formed between the second layer 103 and the first doped region 108. The conductive layer 102 may directly contact the etch stop layer 104.

FIGS. 5A and 5B illustrate a semiconductor device according to a modified example of FIG. 4A. FIG. 5B is a plan view taken along a line A1-A2 of FIG. 5A. The semiconductor device 100B may be similar to the semiconductor device 100A of FIG. 4A. Hereinafter, detailed description on the constituent elements appearing in common will be omitted.

Referring to FIGS. 5A and 5B, the semiconductor device 100B may include a stack body 100S and a pillar structure 100PB penetrating through the stack body 100S.

The pillar structure 100PB may extend vertically in the first direction D1. The pillar structure 100PB may be referred to as a vertical pillar structure. The pillar structure 100PB may include an etch stop layer 104, a high dielectric layer 105, an interface layer 106, and an active layer 107A. The active layer 107A may include a first doped region 108 and a second doped region 109. A vertical channel CH may be defined between the first doped region 108 and the second doped region 109. The first doped region 108 and the second doped region 109 may be referred to as source and drain regions. The high dielectric layer 105 and the interface layer 106 may have a shape whose top and bottom are opened. The active layer 107A may have a shape whose top and bottom are opened. According to another embodiment of the present invention, the active layer 107A may be a tube shape or cylinder shape with an inner space. The inner space of the active layer 107A may be filled with a core dielectric layer 107'. The bottom surfaces of the high dielectric layer 105, the interface layer 106, and the active layer 107A may be positioned at the same level.

The etch stop layer 104 may be discontinuous in the first direction D1. The high dielectric layer 105 and the interface layer 106 may be formed between the vertical channel CH and the conductive layer 102, and the etch stop layer 104 may not be formed. The etch stop layer 104, the high dielectric layer 105, and the interface layer 106 may be formed between the first layer 101 and the second doped region 109. The etch stop layer 104, the high dielectric layer 105, and the interface layer 106 may be formed between the second layer 103 and the first doped region 108. The conductive layer 102 may directly contact the high dielectric layer 105.

FIGS. 6A and 6B illustrate a semiconductor device in accordance with another embodiment of the present invention. FIG. 6B is a plan view taken along a line A1-A2 of FIG. 6A.

Referring to FIGS. 6A and 6B, the semiconductor device 100N may include a stack body 110 and a pillar structure 110P, the pillar structure 110P penetrating through the stack body 110 in a substantially vertical manner.

The stack body 110 may include a first layer 111, a second layer 113, and a conductive layer 124, the conductive layer 124 being formed between the first layer 111 and the second layer 113. For example, the first layer 111 may be formed over a substrate or another layer that is not shown. The conductive layer 124 may be formed over the first layer 111, and the second layer 113 may be formed over the conductive layer 124. The conductive layer 124 may be disposed between the first layer 111 and the second layer 113. The first layer 111, the conductive layer 124, and the second layer 113 may be stacked vertically in the first direction D1. The conductive layer 124 may include a material that is different from the first layer 111 and the second layer 113, and the first layer 111 and the second layer 113 may be of the same material or different materials. The first layer 111 and the second layer 113 may include a dielectric material. The first layer 111 and the second layer 113 may include silicon oxide, silicon nitride, or a combination thereof. The first layer 111 and the second layer 113 may have the same thickness. The first layer 111, the conductive layer 124, and the second layer 113 may have the same thickness. According to another embodiment of the present invention, the conductive layer 124 may be thicker than the first layer 111 and the third layer 113. The conductive layer 124 may include polysilicon, a metal, a metal nitride, a metal silicide, or a combination thereof. The conductive layer 124 may include titanium nitride, tungsten or a stack of titanium nitride and tungsten (TiN/W). The conductive layer 124 may be shaped to surround a sidewall of the pillar structure 110P. The conductive layer 124 may have a planar shape that is parallel to the second direction D2.

The pillar structure 110P may extend in a substantially vertical manner in the first direction D1. The pillar structure 110P may be referred to as a vertical pillar structure. The pillar structure 110P may include an etch stop layer 115, a first blocking layer 116, a second blocking layer 117, a charge trapping layer 118, a tunnel dielectric layer 119, a channel layer 120, and a core dielectric layer 121. The pillar structure 110P may fill a first through portion (not marked, refer to 114 of FIG. 7B).

The etch stop layer 115 may be thinner than the first layer 111, the conductive layer 124, and the second layer 113. The etch stop layer 115 may include a material that is different from that of the conductive layer 124. The etch stop layer 115 may include a material that is different from those of the first layer 111 and the second layer 113. The etch stop layer 115 may include a dielectric material. The etch stop layer 115 may be a carbon-containing material, and the first layer 111 and the second layer 113 may be carbon-free materials. The first layer 111 and the second layer 113 may be carbon-free silicon oxide, and the etch stop layer 115 may be carbon-containing silicon oxide. For example, the first layer 111 and the second layer 113 may be $SiO_2$, and the etch stop layer 115 may be SiCO. SiCO may be more etch-resistant than $SiO_2$.

The first blocking layer 116 may include a material that is different from that of the etch stop layer 115. The first blocking layer 116 may be a metal-containing material. The first blocking layer 116 may include a metal oxide. The first blocking layer 116 may have a greater dielectric constant than the etch stop layer 115. The first blocking layer 116 may include a high-k material. For example, the first blocking layer 116 may include aluminum oxide, hafnium oxide, zirconium oxide, or a combination thereof. The first blocking layer 116 may be thicker than the etch stop layer 115.

The second blocking layer 117 may include a low-k material. The second blocking layer 117 may include a material that is different from those of the etch stop layer 115 and the first blocking layer 116. The second blocking layer 117 may include silicon oxide and may be free of carbon. The second blocking layer 117 may be thicker than the first blocking layer 116.

The charge trapping layer 118 may include a charge trapping dielectric material, such as silicon nitride. The charge trapping layer 118 may be formed to cover the second blocking layer 117.

The tunnel dielectric layer 119 may be formed over the charge trapping layer 118. The tunnel dielectric layer 119 may include silicon oxide.

The channel layer 120 may be formed over the tunnel dielectric layer 119. The channel layer 120 may include a semiconductor material. For example, the channel layer 120 may include any one among a polycrystalline semiconductor material, an amorphous semiconductor material, and a monocrystalline semiconductor material. The channel layer 120 may include silicon (Si), germanium (Ge), silicon germanium (SiGe), a group III-V compound, or a group II-VI compound. The channel layer 120 may include polysilicon.

At least one or more other layers, including the core dielectric layer 121, may be further formed over the channel layer 120.

Referring to FIGS. 6A and 6B, the semiconductor device 100N may be part of a NAND memory cell, and the conductive layer 124 may be a gate electrode or a word line. As will be described later, the conductive layer 124 may be formed by replacing the sacrificial layer with a conductive material through the second through portion 122. During the process of replacing the sacrificial layer with the conductive layer 124, the etch stop layer 115 may protect the first blocking layer 116.

FIGS. 7A to 7H are cross-sectional views, illustrating an example of a method for fabricating a semiconductor device, in accordance with another embodiment of the present invention.

Figure 7A:
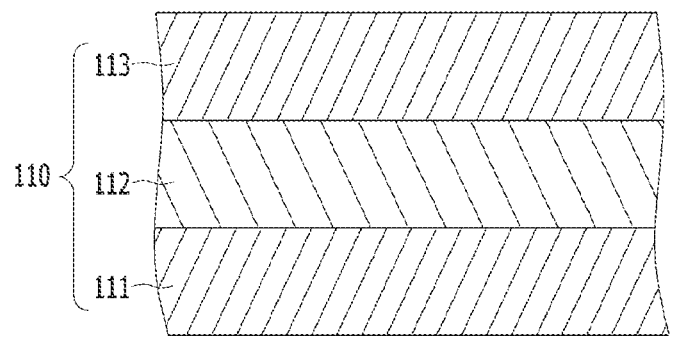

Referring to FIG. 7A, a stacked body 110 may be prepared. The stack body 110 may include a first layer 111, a second layer 113, and a sacrificial layer 112, the sacrificial layer 112 being formed between the first layer 111 and the second layer 113.

For example, the first layer 111 may be formed over a substrate or another layer (not shown). The sacrificial layer 112 may be formed over the first layer 111, and the second layer 113 may be formed over the sacrificial layer 112. The sacrificial layer 112 may be disposed between the first layer 111 and the second layer 113.

The sacrificial layer 112 may include a material that is different from those of the first layer 111 and the second layer 113. Furthermore, the etching selectivity of the sacrificial layer 112, with respect to the first layer 111 and the second layer 113, may be sufficiently large. The first layer 111 and the second layer 113 may be of the same material or of different materials.

The first layer 111 and the second layer 113 may include silicon oxide, and the sacrificial layer 112 may include silicon nitride, a metal material, or polysilicon. The first layer 111 and the second layer 113 may include silicon nitride, and the sacrificial layer 112 may include silicon oxide.

Figure 7B:
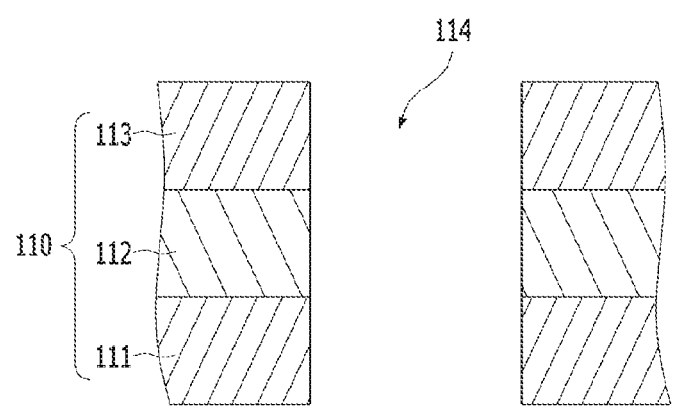

Referring to FIG. 7B, a first through portion 114 may be formed in the stack body 110. The first through portion 114 may be, for example, a hole or a slit that is formed through an anisotropic etching process, such as reactive ion etching (RIE). The first through portion 114 may also be referred to as an opening.

The first through portion 114 may penetrate through the second layer 113, the sacrificial layer 112, and the first layer 111 in a substantially vertical manner. A sidewall of the first through portion 114 may be formed by etching the surface of the first layer 111, the sacrificial layer 112, and the second layer 113.

Figure 7C:
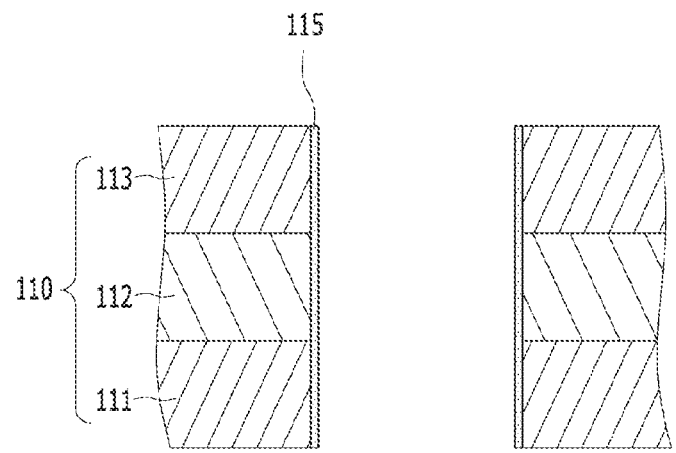

Referring to FIG. 7C, the etch stop layer 115 may be formed to cover the sidewall of the first through portion 114. The etch stop layer 115 may be formed to cover the sidewall of the first through portion 114. The etch stop layer 115 may be thinner than the first layer 111, the sacrificial layer 112, and the second layer 113. The etch stop layer 115 may include a material that is different from that of the sacrificial layer 112. Furthermore, the etching selectivity of the etch stop layer 115, with respect to the sacrificial layer 112, may be sufficiently large. The etch stop layer 115 may include a material that is different from those of the first layer 111 and the second layer 113. The etch stop layer 115 may be a carbon-containing material, and the first layer 111 and the second layer 113 may be carbon-free materials. The first layer 111 and the second layer 113 may be carbon-free silicon oxide, and the etch stop layer 115 may be carbon-containing silicon oxide. For example, the first layer 111 and the second layer 113 may be $SiO_2$, and the etch stop layer 115 may be SiCO. While the sacrificial layer 112 is etched subsequently, SiCO may be more etch-resistant than $SiO_2$.

Figure 7D:
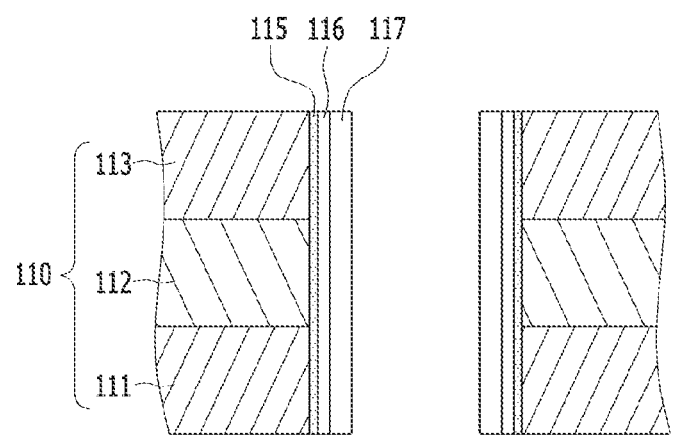

Referring to FIG. 7D, the first blocking layer 116 may be formed over the etch stop layer 115. The first blocking layer 116 may include a material that is different from that of the etch stop layer 115. The first blocking layer 116 may be a metal-containing material. The first blocking layer 116 may include a metal oxide. The first blocking layer 116 may have a greater dielectric constant than the etch stop layer 115. The first blocking layer 116 may include a high-k material. For example, the first blocking layer 116 may include aluminum oxide, hafnium oxide, zirconium oxide, or a combination thereof. The first blocking layer 116 may be thicker than the etch stop layer 115.

The second blocking layer 117 may be formed over the first blocking layer 116. The second blocking layer 117 may include a material that is different from that of the first blocking layer 116. The second blocking layer 117 may be thicker than the first blocking layer 116. The second blocking layer 117 may have a smaller dielectric constant than the first blocking layer 116. The second blocking layer 117 may include a low-k material. The second blocking layer 117 may include a material that is different from that of the etch stop layer 115. The second blocking layer 117 may include silicon oxide and may be free of carbon.

As described above, an in-plugged blocking structure, including the first blocking layer 116 and the second blocking layer 117, disposed in the first through portion 114, may be formed. When the first blocking layer 116 includes alumina (or aluminum oxide), the first blocking layer 116 may be referred to as an in-plugged alumina blocking structure.

Figure 7E:
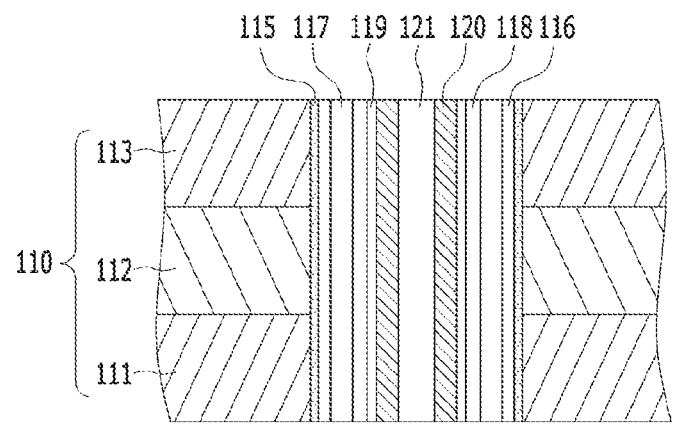

Referring to FIG. 7E, a charge trapping layer 118 may be formed over the second blocking layer 117. The charge trapping layer 118 may include a charge trapping dielectric material, such as silicon nitride. The charge trapping layer 118 may be formed through a conformal deposition process, such as Chemical Vapor Deposition (CVD) or Atomic Layer Deposition (ALD). The charge trapping layer 118 may be conformally deposited over the second blocking layer 117.

A tunnel dielectric layer 119 may be formed over the charge trapping layer 118. The tunnel dielectric layer 119 may include silicon oxide. The tunnel dielectric layer 119 may be formed through a conformal deposition process, such as chemical vapor deposition (CVD) or atomic layer deposition (ALD). Tunnel dielectric layer 119 may be conformally deposited over the charge trapping layer 118.

The channel layer 120 may be formed over the tunnel dielectric layer 119. The channel layer 120 may include a semiconductor material. For example, the channel layer 120 may include one of a polycrystalline semiconductor material, an amorphous semiconductor material, and a monocrystalline semiconductor material. The channel layer 120 may include silicon (Si), germanium (Ge), silicon germanium (SiGe), a group III-V compound, or a group II-VI compound. The channel layer 120 may include polysilicon. The channel layer 120 may be formed to cover the tunnel dielectric layer 119 in the first through portion 114. The channel layer 120 might not fill the first through portion 114.

At least one or more other layers, including a core dielectric layer 121, may be further formed over the channel layer 120. The core dielectric layer 121 may fill the first through portion 114.

Figure 7F:
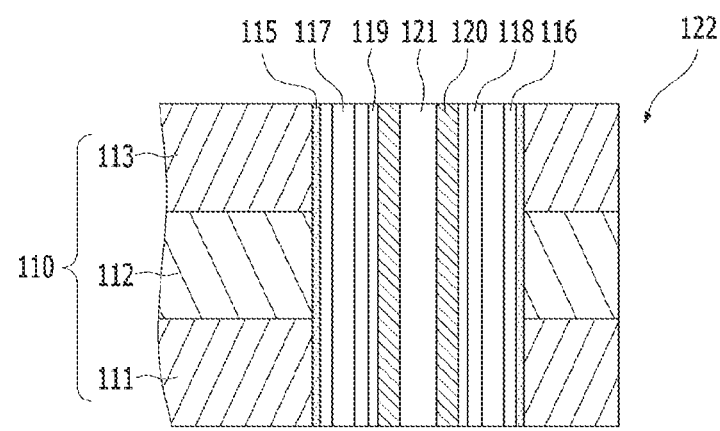

Referring to FIG. 7F, a second through portion 122 may be formed in a portion of the stack body 110. The second through portion 122 may be, for example, a hole or a slit formed through an anisotropic etching process, such as reactive ion etching (RIE). The second through portion 122 may be referred to as an opening. The first through portion 114 may have a hole shape, and the second through portion 122 may have a slit shape.

The second through portion 122 may penetrate through the second layer 113, the sacrificial layer 112, and the first layer 111 in a substantially vertical manner. A sidewall of the second through portion 122 may be formed by etching the surface of the first layer 111, the sacrificial layer 112, and the second layer 113.

Figure 7G:
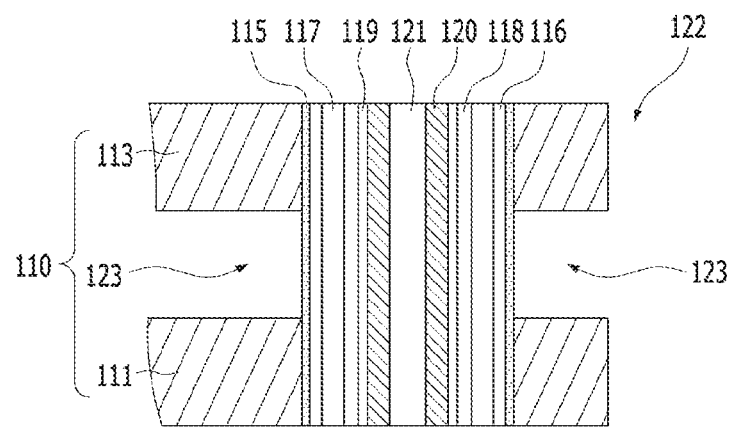

Referring to FIG. 7G, the sacrificial layer 112 may be selectively removed. When an etchant or an etching gas is supplied to the second through portion 122, the sacrificial layer 112 may be selectively etched. For example, when the sacrificial layer 112 is silicon oxide, the silicon oxide may be etched by supplying an etchant with hydrofluoric acid to the second through portion 122. The first layer 111 and the second layer 113 may be, for example, silicon nitride or a metal material, and the metal material and silicon nitride may have etch resistance to an etchant with hydrofluoric acid.

According to another embodiment of the present invention, when the sacrificial layer 112 is silicon nitride, the silicon nitride may be etched by supplying an etchant with phosphoric acid to the second through portion 122. The first layer 111 and the second layer 113 may be, for example, silicon oxide, and the silicon oxide may have etch resistance to an etchant with phosphoric acid.

The etching of the sacrificial layer 112 may proceed from an end surface of the sacrificial layer 112 exposed through the second through portion 122. The end surface of the sacrificial layer 112 may be recessed in a diametral or width direction through the second through portion 122.

By etching the sacrificial layer 112, an air gap 123, continuous from the second through portion 122, may be formed between the first layer 111 and the second layer 113. The sacrificial layer 112 might not remain between the first layer 111 and the second layer 113. For example, all of the sacrificial layers 112 may be removed, and as a result, the etch stop layer 115 may be exposed. The air gap 123 may be formed between the second through portion 122 and the etch stop layer 115. The etch stop layer 115 may control the end point of the etching process for the sacrificial layer 112. The etching process of the sacrificial layer 112 may include a dip-out process.

As described above, the etch stop layer 115 may protect the first blocking layer 116 while the sacrificial layer 112 is etched.

According to another embodiment of the present invention, after the sacrificial layer 112 is removed, a converting process for the etch stop layer 115 may be performed. The converting process may expose the etch stop layer 115 to a plasma treatment or a thermal treatment. The etching stop layer 115 may be converted into a carbon-free material through the converting process. For example, SiCO may be converted to $SiO_2$.

Figure 7H:
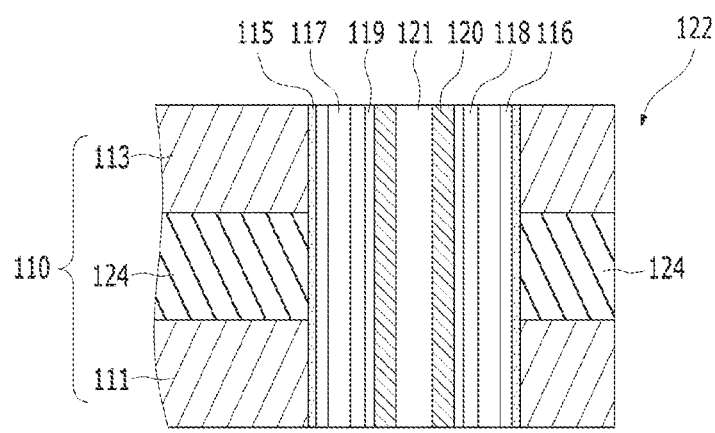

Referring to FIG. 7H, a conductive layer 124 may be formed. The conductive layer 124 may include polysilicon, a metal, a metal nitride, a metal silicide, or a combination thereof. The conductive layer 124 may include titanium nitride, tungsten or a stack of titanium nitride and tungsten. The conductive layer 124 may be formed in the air gap 123. The conductive layer 124 may be formed by depositing a conductive material to fill the air gap 123 and then by performing an etch-back process on the conductive material. The conductive layer 124 may be disposed between the first layer 111 and the second layer 113. The conductive layer 124 may serve as a gate electrode.

The conductive layer 124 may fully fill the air gap 123, while not overflowing into the second through portion 122. The conductive layer 124 may directly contact the etch stop layer 115.

As described above, since the air gap 123 is filled only with the conductive layer 124, the gap-fill characteristic of the conductive layer 124 may be improved. No material, other than the conductive layer 124, may be formed in the air gap 123. For example, the etch stop layer 115, the first blocking layer 116, and the second blocking layer 117 might not be formed in the air gap 123. Accordingly, the gap between the conductive layers 124 that are adjacent to each other vertically may be reduced.

A multi-layered stack may be formed between the channel layer 120 and the conductive layer 124. The multi-layered stack may include the etch stop layer 115, the first blocking layer 116, the second blocking layer 117, the charge trapping layer 118, and the tunnel dielectric layer 119.

FIGS. 8A and 8B are cross-sectional views, illustrating an example of a method for fabricating a semiconductor device, in accordance with another embodiment of the present invention.

First, an air gap 123 may be formed through a series of processes illustrated in FIGS. 7A to 7G.

Subsequently, as shown in FIG. 8A, a portion of the etch stop layer 115, exposed by the air gap 123, may be removed. Accordingly, some surfaces 116S of the first blocking layer 116 may be exposed, and the air gap 123 may be horizontally extended. In other words, the widened air gap 123' may be formed. The air gap 123' may be horizontally wider than the air gap 123 of FIG. 7G.

The process to remove a portion of the etch stop layer 115 may include dry etching. According to another embodiment of the present invention, even when the etch stop layer 115 is converted into $SiO_2$, a portion of the etch stop layer 115 may be removed by dry etching.

Referring to FIG. 8B, a conductive layer 124 may be formed. The conductive layer 124 may include polysilicon, a metal, a metal nitride, a metal silicide, or a combination thereof. The conductive layer 124 may include titanium nitride, tungsten or a stack of titanium nitride and tungsten. The conductive layer 124 may be formed in the air gap 123'. The conductive layer 124 may be formed by depositing a conductive material to fill the air gap 123' and then by performing an etch-back process on the conductive material. The conductive layer 124 may be disposed between the first layer 111 and the second layer 113. The conductive layer 124 may serve as a gate electrode.

The conductive layer 124 may fully fill the air gap 123', while not overflowing into the second through portion 122. The conductive layer 124 may be in direct contact with the first blocking layer 116.

As described above, since the air gap 123' is filled only with the conductive layer 124, the gap-fill characteristic of the conductive layer 124 may be improved. No material, other than the conductive layer 124, may be formed in the air gap 123'. For example, the etch stop layer 115, the first blocking layer 116, and the second blocking layer 117 might not be formed in the air gap 123'. Accordingly, the volume of the conductive layer 124 filling the air gap 123' may be increased.

FIGS. 9A and 9B illustrates a semiconductor device 200V in accordance with another embodiment of the present invention. FIG. 9B is a plan view taken along a line A1-A2 of FIG. 9A.

Referring to FIGS. 9A and 9B, the semiconductor device 200V may include a vertical NAND. The semiconductor device 200V may include a three-dimensional (3D) NAND. The semiconductor device 200V may include a lower structure 200L, a stack body 210 over the lower structure 200L, and a vertical channel structure 220 that penetrates through the stack body 210.

The lower structure 200L may include a substrate. According to another embodiment of the present invention, the lower structure 200L may include a peripheral circuit. The peripheral circuit unit may include a plurality of control circuits. At least one control circuit of the peripheral circuit portion may include an N-channel transistor, a P-channel transistor, a CMOS circuit, or a combination thereof. At least one control circuit of the peripheral circuit may include a planar channel transistor, a recess channel transistor, a buried gate transistor, a fin channel transistor (FinFET), and the like. The lower structure 200L and the stack body 210 may be interconnected to each other through a multi-level metal wire (not shown).

The stack body 210 may include a stack of word lines 212 and dielectric layers 211, stacked in an alternating manner, positioned over the lower structure 200L. The vertical channel structure 220, including a channel layer 226, may be formed in the through portion that penetrates through the alternating stack. A first blocking layer 222 may be formed in the through portion to surround the outer wall of the channel layer 225. An etch stop layer 221, surrounding the outer wall of the first blocking layer 222, may be included in the through portion. The etch stop layer 221 may be in direct contact with the word lines 212 and the dielectric layers 211. The etch stop layer 221 may be a continuous etch stop layer, extending vertically along the stacking direction of the alternating stack. The first blocking layer 222 may extend vertically in the stacking direction of the alternating stack.

The stack body 210 may be formed by stacking the dielectric layer 211 and the word line 212 in an alternating manner. The vertical channel structure 220 may penetrate through the stack body 210 in a substantially vertical manner.

The word line 212 may include a material that surrounds the vertical channel structure 220.

The vertical channel structure 220 may include an etch stop layer 221 which is in contact with the word line 212, a first blocking layer 222, a second blocking layer 223, a charge trapping layer 224, a tunnel dielectric layer 225, and a channel layer 226. The inner space of the channel layer 226 may be filled with the core dielectric layer 227.

The dielectric layer 211 may be formed over the lower structure 200L. The word line 212 may be disposed between the dielectric layers 211. The word line 212 may include polysilicon, a metal, a metal nitride, a metal silicide, or a combination thereof. The word line 212 may include titanium nitride, tungsten or a stack of titanium nitride and tungsten (TiN/W). The word line 212 may be shaped to surround the sidewall of the vertical channel structure 220. The word line 212 may have a planar shape.

The etch stop layer 221 may include a dielectric material. The etch stop layer 221 may be a carbon-containing material, and the dielectric layer 211 may be a carbon-free material. The dielectric layer 211 may be a carbon-free silicon oxide, and the etch stop layer 221 may be a carbon-containing silicon oxide. For example, the dielectric layer 211 may be $SiO_2$, and the etch stop layer 221 may be SiCO. SiCO may be more etch-resistant than $SiO_2$. The etch stop layer 221 may be a continuous etch stop layer that is continuous along the stacking direction of the dielectric layer 211 and the word line 212.

The first blocking layer 222 may include a material that is different from that of the etch stop layer 221. The first blocking layer 222 may be a metal-containing material. The first blocking layer 222 may include a metal oxide. The first blocking layer 222 may have a greater dielectric constant than the etch stop layer 221. The first blocking layer 222 may include a high-k material. For example, the first blocking layer 222 may include aluminum oxide, hafnium oxide, zirconium oxide, or a combination thereof. The first blocking layer 222 may be thicker than the etch stop layer 221.

The second blocking layer 223 may include a low-k material. The second blocking layer 223 may include a material that is different from those of the etch stop layer 221 and the first blocking layer 222. The second blocking layer 223 may include silicon oxide and may be free of carbon. The second blocking layer 223 may be thicker than the first blocking layer 222.

The charge trapping layer 224 may include a charge trapping dielectric material, such as silicon nitride. The charge trapping layer 224 may be formed to cover the second blocking layer 222.

A tunnel dielectric layer 225 may be formed over the charge trapping layer 224. The tunnel dielectric layer 225 may include silicon oxide.

The channel layer 226 may be formed over the tunnel dielectric layer 225. The channel layer 226 may include a semiconductor material. For example, the channel layer 226 may include any one among a polycrystalline semiconductor material, an amorphous semiconductor material, and a monocrystalline semiconductor material. The channel layer 226 may include silicon (Si), germanium (Ge), silicon germanium (SiGe), a group III-V compound, or a group II-VI compound. The channel layer 226 may include polysilicon.

At least one or more other layers, including a core dielectric layer 227, may be further formed over the channel layer 226.

Referring to FIGS. 9A and 9B, a blocking-free structure in which only the word line 212 is disposed may be formed between the dielectric layers 211. As a result, the resistance of the word line 212 may be reduced by increasing the volume of the word line 212 without decreasing the height of the memory cell stack.

The etch stop layer 221 may have a thickness that is thinner than that of the first blocking layer 222, and thus might not cause deterioration in the characteristics of a capacitor between the word line 212 and the charge trapping layer 224. The etch stop layer 221 may have a thickness of approximately 30 Å.

FIGS. 10A to 10H are cross-sectional views, illustrating an example of a method for fabricating a semiconductor device, in accordance with another embodiment of the present invention.

Figure 10A:
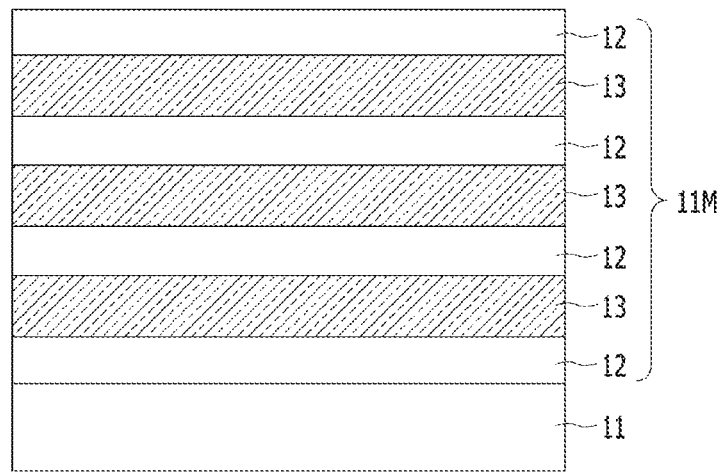

Referring to FIG. 10A, an alternating stack 11M may be formed over the substrate 11. The substrate 11 may be a material that is suitable for semiconductor processing. The substrate 11 may include a semiconductor substrate. For example, the substrate 11 may be a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, a combination thereof, or a multi-layer thereof. The substrate 11 may include other semiconductor materials, such as germanium. The substrate 11 may include a group III/V semiconductor substrate, such as a compound semiconductor substrate, e.g., GaAs. The substrate 11 may include a Silicon-On-Insulator (SOI) substrate.

The alternating stack 11M may be a stack body in which the first material layer and the second material layer may be alternately stacked. The first material layer may include a first material, and the second material layer may include a second material. The first material and the second material may be of different materials. The first material layer and the second material layer may include a dielectric layer 12 and a sacrificial layer 13, respectively. The dielectric layer 12 may include a dielectric material, and the sacrificial layer 13 may include a sacrificial material. Herein, the 'sacrificial material' may refer to a substance to be removed in the subsequent process. The dielectric layer 12 may include at least one dielectric material among silicon oxide, silicon nitride, silicon oxynitride, a spin-on-dielectric material (SOD), a dielectric metal oxide, a silicate, and a dielectric metal oxynitride.

The sacrificial layer 13 may include a sacrificial material that may be selectively removed with respect to the dielectric layer 12. Herein, the removal of the sacrificial layer 13 may be optional with respect to the dielectric layer 12. The ratio of the removal rate of the sacrificial layer 13 to the removal rate of the dielectric layer 12 may be referred to as a selectivity of the removal process of the sacrificial layer 13 with respect to the dielectric layer 12.

The sacrificial layer 13 may include a dielectric material. The sacrificial layer 13 may be replaced with a conductive material in a subsequent process. For example, it may be replaced with the gate electrode (or word line) of the vertical NAND device. The sacrificial layer 13 may include silicon nitride, amorphous silicon, or polysilicon. According to an embodiment of the present invention, the sacrificial layer 13 may include silicon nitride.

According to the embodiment of the present invention, the dielectric layer 12 may include silicon oxide, and the sacrificial layer 13 may include silicon nitride.

The alternating number of dielectric layers 12 and sacrificial layers 13, in the alternating stack 11M, may be determined according to the number of memory cells. For example, when 48 memory cells are stacked vertically, the dielectric layer 12 and the sacrificial layer 13 may be stacked 48 times, individually. The dielectric layer 12 and the sacrificial layer 13 may be repeatedly stacked in a direction that is perpendicular to the surface of the substrate 11.

The dielectric layer 12 may be deposited through a Chemical Vapor Deposition (CVD) process or Atomic Layer Deposition (ALD) process. The sacrificial layer 13 may be deposited through a chemical vapor deposition process or an atomic layer deposition process.

The bottom and top layers of the alternating stack 11M may be the dielectric layers 12. The dielectric layer 12 and the sacrificial layer 13 may have the same thickness. The top dielectric layer 12 may be thicker than the other dielectric layers 12. The top dielectric layer 12 may be referred to as a dielectric cap layer.

Figure 10B:
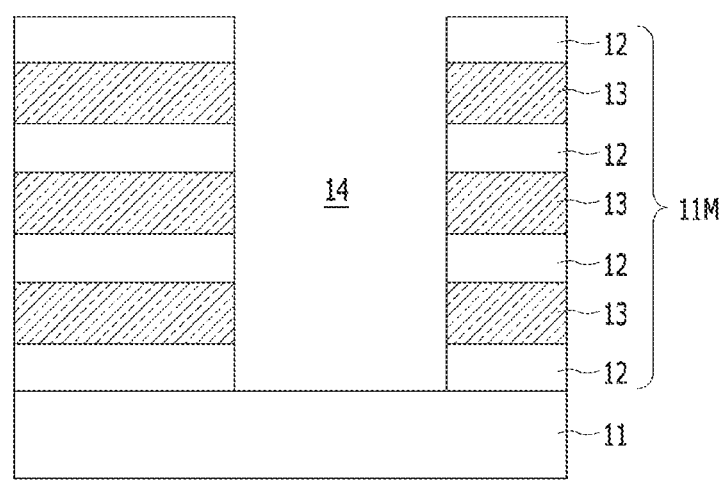

Referring to FIG. 10B, a first through portion 14 may be formed in the alternating stack 11M. A portion of the alternating stack 11M may be etched using a mask (not shown) to form the first through portion 14. The mask may include a resist pattern, and the resist pattern may be formed by applying a resist material and performing a photolithography process. The resist material may include a photoresist. The process of etching the alternating stack 11M to form the first through portion 14 may include an anisotropic etch process. For example, the anisotropic etching may include reactive ion etching (RIE). The reactive ion etching of the dielectric layers 12 and the reactive ion etching of the sacrificial layers 13 may be performed continuously.

The first through portion 14 may penetrate through the alternating stack 11M and extend in a direction that is perpendicular to the surface of the substrate 11. The bottom of the first through portion 14 may expose the surface of the substrate 11. The first through portion 14 may include a vertical hole. A plurality of first through portions 14 may be arranged. From the perspective of a top view, the first through portions 14 may be arranged in a zigzag arrangement. Each of the first through portions 14 may have a uniform size.

The sidewall of the first through portion 14 may have a vertical profile. According to another embodiment of the present invention, the sidewall of the first through portion 14 may have a sloped profile. The first through portion 14 may be referred to as a channel hole or a vertical hole.

The first through portion 14 may penetrate through the dielectric layers 12 and the sacrificial layers 13 in a substantially vertical manner. The sidewall of the first through portion 14 may be formed by etching the surface of the dielectric layers 12 and the sacrificial layers 13.

Figure 10C:
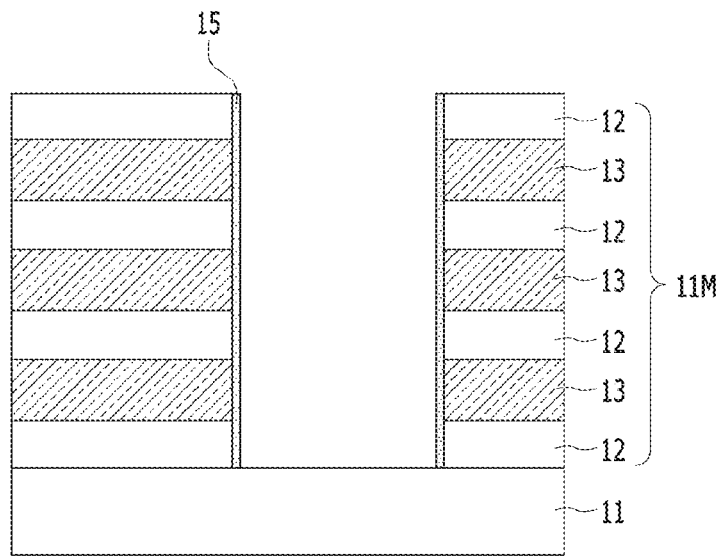

Referring to FIG. 10C, an etch stop layer 15 may be formed to cover the sidewall of the first through portion 14. The etch stop layer 15 may be formed to cover the sidewall of the first through portion 14. Although not shown, the etch stop layer 15 may cover the bottom surface of the first through portion 14. The etch stop layer 15 may be thinner than the dielectric layer 12 and the sacrificial layer 13. The etch stop layer 15 may include of a material that is different from the sacrificial layer 13. Furthermore, the etching selectivity of the etch stop layer 15, with respect to the sacrificial layer 13, may be sufficiently large. The etch stop layer 15 may include a material that is different from that of the dielectric layer 12. The etch stop layer 15 may be a carbon-containing material, and the dielectric layer 12 may be a carbon-free material. The dielectric layer 12 may be carbon-free silicon oxide, and the etch stop layer 15 may be carbon-containing silicon oxide. For example, the dielectric layer 12 may be $SiO_2$ and the etch stop layer 15 may be SiCO. While the subsequent sacrificial layer 13 is etched, SiCO may be more etch resistant than $SiO_2$.

The etch stop layer 15 may have a thickness of approximately 30 Å.

Figure 10D:
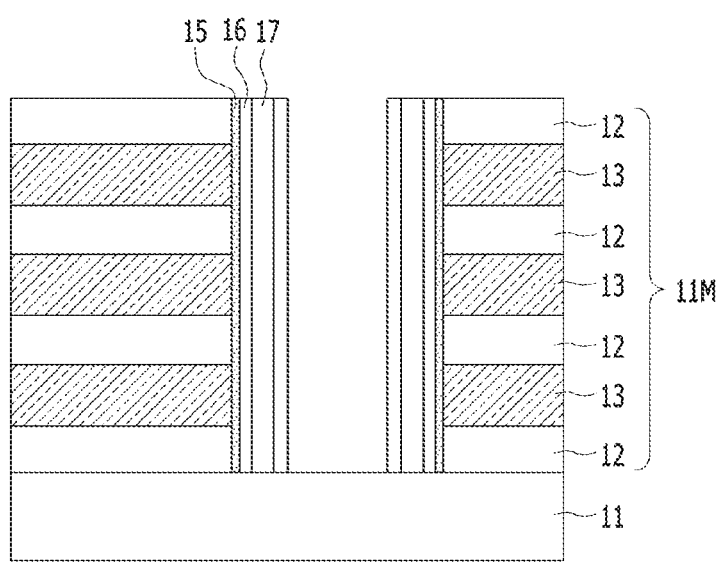

Referring to FIG. 10D, a first blocking layer 16 may be formed over the etch stop layer 15. The first blocking layer 16 may include a material that is different from that of the etch stop layer 15. The first blocking layer 16 may be a metal-containing material. The first blocking layer 16 may include a metal oxide. The first blocking layer 16 may have a greater dielectric constant than the etch stop layer 15. The first blocking layer 16 may include a high-k material. For example, the first blocking layer 16 may include aluminum oxide, hafnium oxide, zirconium oxide, or a combination thereof. The first blocking layer 16 may be thicker than the etch stop layer 15. The first blocking layer 16 may be formed to a thickness of approximately 20 Å to 100 Å.

The second blocking layer 17 may be formed over the first blocking layer 16. The second blocking layer 17 may include a material that is different from that of the first blocking layer 16. The second blocking layer 17 may be thicker than the first blocking layer 16. The second blocking layer 17 may have a smaller dielectric constant than that of the first blocking layer 16. The second blocking layer 17 may include a low-k material. The second blocking layer 17 may include a material that is different from that of the etch stop layer 15. The second blocking layer 17 may include silicon oxide and may be free of carbon.

As described above, an in-plugged blocking structure, including the first blocking layer 16 and the second blocking layer 17, disposed in the first through portion 14, may be formed. When the first blocking layer 16 includes alumina (or aluminum oxide), the first blocking layer 16 may be called an in-plugged alumina blocking structure.

Figure 10E:
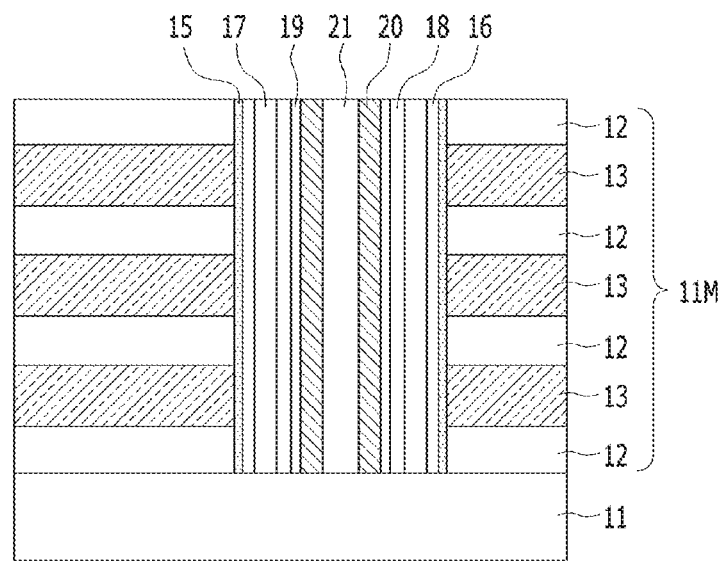

Referring to FIG. 10E, a charge trapping layer 18 may be formed over the second blocking layer 17. The charge trapping layer 18 may include a charge trapping dielectric material, such as silicon nitride. The charge trapping layer 18 may be formed through a conformal deposition process, such as chemical vapor deposition (CVD) or atomic layer deposition (ALD). The charge trapping layer 18 may be conformally deposited over the second blocking layer 17.

A tunnel dielectric layer 19 may be formed over the charge trapping layer 18. The tunnel dielectric layer 19 may include silicon oxide. The tunnel dielectric layer 19 may be formed through a conformal deposition process, such as chemical vapor deposition (CVD) or atomic layer deposition (ALD). The tunnel dielectric layer 19 may be conformally deposited over the charge trapping layer 18.

According to another embodiment of the present invention, although not illustrated, the first blocking layer 16, the second blocking layer 17, the charge trapping layer 18, and the tunnel dielectric layer 19 may cover the bottom surface of the first through portion 14. After the tunnel dielectric layer 19 is formed, a portion of the tunnel dielectric layer 19 may be cut from the bottom surface of the first through portion 14. After the tunnel dielectric layer 19 is cut, the charge trapping layer 18, the second blocking layer 17, the first blocking layer 16 and the etch stop layer 15 may be sequentially cut from the bottom surface of the first through portion 14.

The channel layer 20 may be formed over the tunnel dielectric layer 19. The channel layer 20 may include a semiconductor material. For example, the channel layer 20 may include any one among a polycrystalline semiconductor material, an amorphous semiconductor material, or a monocrystalline semiconductor material. The channel layer 20 may include silicon (Si), germanium (Ge), silicon germanium (SiGe), a group III-V compound, or a group II-VI compound. The channel layer 20 may include polysilicon. The channel layer 20 may be formed to cover the tunnel dielectric layer 19 in the first through portion 14. The channel layer 20 might not fill the first through portion 14.

At least one or more other layers including a core dielectric layer 21 may be further formed over the channel layer 20. The core dielectric layer 21 may fill the first through portion 14.

Figure 10F:
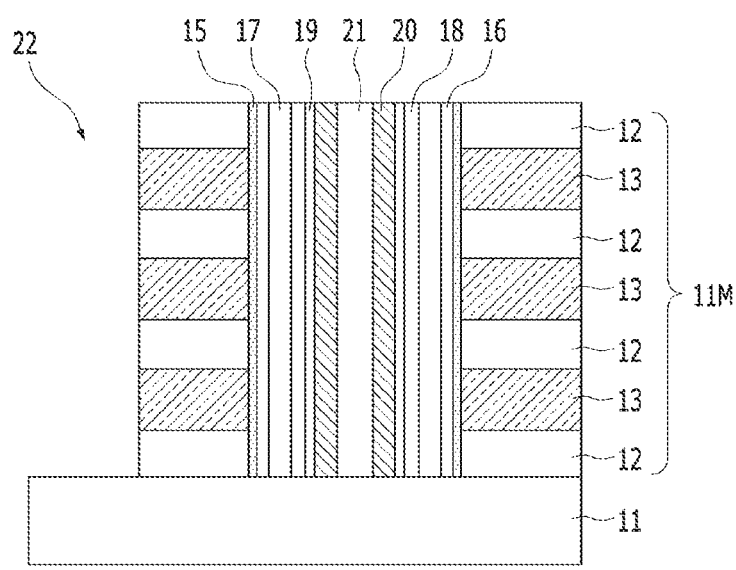

Referring to FIG. 10F, a second through portion 22 may be formed in a portion of the alternating stack 11M. The second through portion 22 may be, for example, a hole or a slit that is formed through an anisotropic etching process, such as reactive ion etching (RIE). The second through portion 22 may be referred to as an opening. The first through portion 14 may have a hole shape, and the second through portion 22 may have a slit shape.

The second through portion 22 may penetrate through the dielectric layers 12 and the sacrificial layers 13 in a substantially vertical manner. The sidewall of the second through portion 22 may be formed by etching the surface of the dielectric layers 12 and the sacrificial layers 13.

Figure 10G:
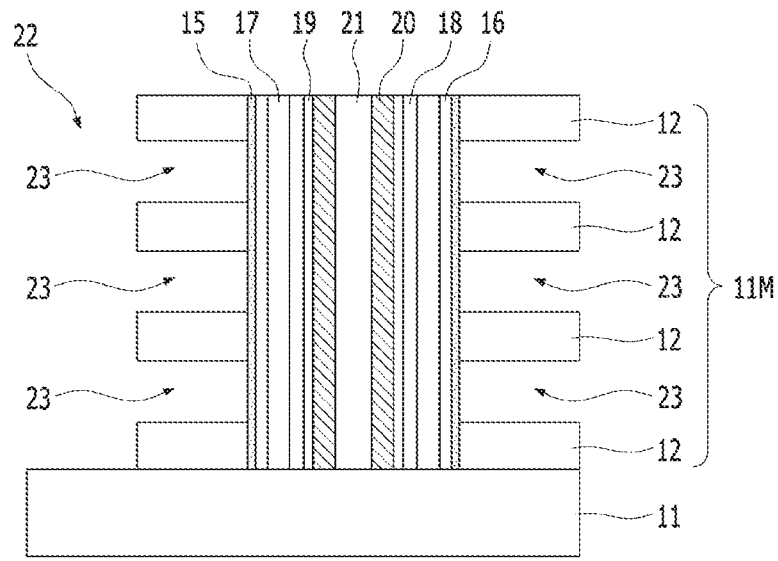

Referring to FIG. 10G, the sacrificial layers 13 may be selectively removed. When an etchant or an etching gas is supplied to the second through portion 22, the sacrificial layer 13 may be selectively etched. For example, when the sacrificial layer 13 is silicon oxide, the silicon oxide may be etched by supplying an etchant with hydrofluoric acid to the second through portion 22. The dielectric layers 12 may be, for example, silicon nitride or a metal material, and the metal material and silicon nitride may have etch resistance to the etchant with hydrofluoric acid.

According to another embodiment of the present invention, when the sacrificial layers 13 are silicon nitride, the silicon nitride may be etched by supplying an etchant with phosphoric acid to the second through portion 22. The dielectric layers 12 may be, for example, silicon oxide, and the silicon oxide may have etch resistance to an etchant with phosphoric acid.

The etching of the sacrificial layers 13 may proceed from an end surface of the sacrificial layer 13 exposed through the second through portion 22. The end surface of the sacrificial layer 13 may be recessed in the diametral or width direction of the second through portion 22.

By etching the sacrificial layer 13, an air gap 23 continuous from the second through portion 22 may be formed between the dielectric layers 12. The sacrificial layer 13 might not remain between the dielectric layers 12. For example, all of the sacrificial layer 13 may be removed, and as a result, the etch stop layer 15 may be exposed. The air gap 23 may be formed between the second through portion 22 and the etch stop layer 15. The etch stop layer 15 may control the etching end point at which the etching of the sacrificial layer 13 ends. The process of etching the sacrificial layer 13 may include a dip-out process.

As described above, the etch stop layer 15 may protect the first blocking layer 16 while the sacrificial layer 13 is etched.

According to another embodiment of the present invention, after the sacrificial layer 13 is removed, a converting process for the etch stop layer 15 may be performed. The converting process may expose the etch stop layer 15 to a plasma treatment or a thermal treatment. The etching stop layer 15 may be converted to a carbon-free material by the converting process. For example, SiCO may be converted into $SiO_2$. The converting process may include a thermal treatment or a plasma treatment.

Figure 10H:
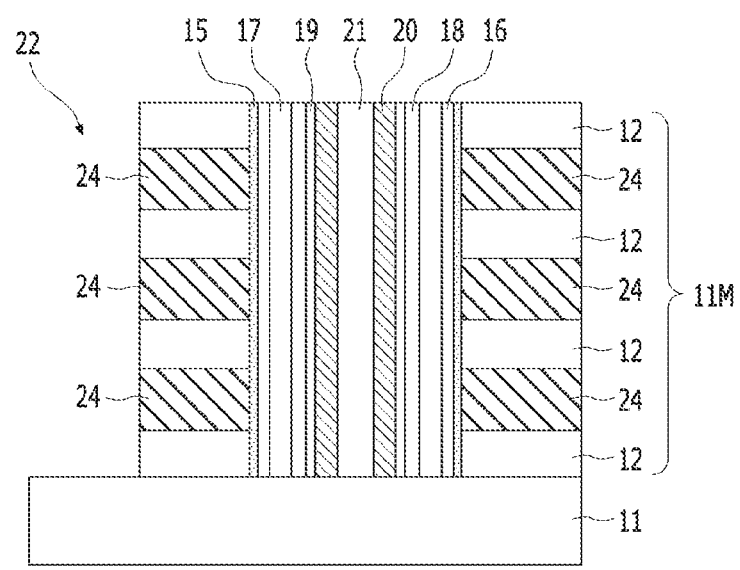

Referring to FIG. 10H, a conductive layer 24 may be formed. The conductive layer 24 may include polysilicon, a metal, a metal nitride, a metal silicide, or a combination thereof. The conductive layer 24 may include titanium nitride, tungsten or a stack of titanium nitride and tungsten. The conductive layer 24 may be formed in the air gap 23. The conductive layer 24 may be formed by depositing a conductive material to fill the air gap 23 and then performing an etch-back process on the conductive material. The conductive layer 24 may be disposed between the dielectric layers 12. The conductive layer 24 may serve as a gate electrode or a word line.

The conductive layer 24 may fully fill the air gap 23, while not overflowing into the second through portion 22. The conductive layer 24 may directly contact the etch stop layer 15.

As described above, since the air gap 23 is filled only with the conductive layer 24, the gap-fill characteristic of the conductive layer 24 may be improved. No material, other than the conductive layer 24, may be formed in the air gap 23. For example, the etch stop layer 15, the first blocking layer 16, and the second blocking layer 17 might not be formed in the air gap 23. As a result, the gap between the conductive layers 24 that are vertically adjacent to each other may be reduced. Since the first blocking layer 16 is not formed inside the air gap 23, poor step coverage of the first blocking layer 16 may be prevented.

A multi-layered stack may be formed between the channel layer 20 and the conductive layer 24. The multi-layered stack may include an etch stop layer 15, a first blocking layer 16, a second blocking layer 17, a charge trapping layer 18, and a tunnel dielectric layer 19.

An alternating stack 11M may be formed over the substrate 11, and the alternating stack 11M may be formed by alternately stacking the dielectric layer 12 and the conductive layer 24. A blocking-free structure in which only the conductive layer 24 is disposed between the dielectric layers 12 may be formed. The etch stop layer 15 may be disposed between the conductive layer 24 and the first blocking layer 16. The etch stop layer 15 may be disposed between the dielectric layer 12 and the first blocking layer 16.

FIGS. 11A and 11B are cross-sectional views, illustrating an example of a method for fabricating a semiconductor device, in accordance with another embodiment of the present invention.

First, an air gap 23 may be formed through a series of processes illustrated in FIGS. 10A to 10G.

Subsequently, as shown in FIG. 11A, a portion of the etch stop layer 15, exposed by the air gap 23, may be removed. As a result, the surface 16S of a portion of the first blocking layer 16 may be exposed, and the air gap 23 may horizontally extend. In short, a wider air gap 23' may be formed. The air gap 23' may be horizontally wider than the air gap 23 of FIG. 10G.

The process to remove a portion of the etch stop layer 15 may include a dry etching process or a wet etching process. According to another embodiment of the present invention, even when the etch stop layer 15 is converted into $SiO_2$, a portion of the etch stop layer 15 may be removed by a dry etching process or a wet etching process.

Referring to FIG. 11B, a conductive layer 24 may be formed. The conductive layer 24 may include polysilicon, a metal, a metal nitride, a metal silicide, or a combination thereof. The conductive layer 24 may include titanium nitride, tungsten or a stack of titanium nitride and tungsten. The conductive layer 24 may be formed in the air gap 23'. The conductive layer 24 may be formed by depositing a conductive material to fill the air gap 23' and then by performing an etch-back process on the conductive material. The conductive layer 24 may be disposed between the dielectric layers 12. The conductive layer 24 may serve as a gate electrode.

The conductive layer 24 may fully fill the air gap 23', while not overflowing into the second through portion 22. The conductive layer 24 may directly contact the first blocking layer 16.

As described above, since the air gap 23' is filled only with the conductive layer 24, the gap-fill characteristic of the conductive layer 24 may be improved. No material, other than the conductive layer 24, may be formed in the air gap 23'. For example, the etch stop layer 15, the first blocking layer 16, and the second blocking layer 17 might not be formed in the air gap 23'. As a result, the volume of the conductive layer 24 filling the air gap 23' may be increased.

The conductive layer 24 and the first blocking layer 16 may be in direct contact with each other, and the etch stop layer 15 may be disposed between the dielectric layer 12 and the first blocking layer 16.

According to the embodiments of the present invention, the resistance of word lines may be reduced by forming the word lines in a blocking-free structure.

According to the embodiments of the present invention, both the difficulty of a high aspect ratio etching process and the production cost may be reduced by decreasing a pitch of a dielectric layer and a sacrificial layer according to an increase in the number of stacked layers of the dielectric layer and the sacrificial layer so as to reduce the total height.

According to the embodiments of the present invention, step coverage of a blocking layer may be improved as the number of rows in a memory block increases.

According to the embodiments of the present invention, it is possible to protect a blocking layer from being attacked by a wet-etch chemical, when a sacrificial layer is removed.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   an alternating stack of conductive layers and dielectric layers disposed over a substrate;
   a channel layer disposed in a through portion, penetrating through the alternating stack;
   a first blocking layer disposed in the through portion, surrounding an outer wall of the channel layer;
   a continuous etch stop layer continuous along the through portion, surrounding an outer wall of the first blocking layer; and
   a second blocking layer disposed between the channel layer and the first blocking layer, wherein the continuous etch stop layer is formed of a single layer of a carbon-containing material, and wherein the continuous etch stop layer is thinner than the first blocking layer.

2. The semiconductor device of claim 1, wherein the continuous etch stop layer is in direct contact with the conductive layers and the dielectric layers.

3. The semiconductor device of claim 1, wherein the continuous etch stop layer extends substantially vertically in a direction in which the alternating stack is stacked.

4. The semiconductor device of claim 1, wherein the first blocking layer substantially vertically extends in a direction in which the alternating stack is stacked.

5. The semiconductor device of claim 1, wherein the continuous etch stop layer and the dielectric layers include different materials.

6. The semiconductor device of claim 1, wherein the continuous etch stop layer includes a carbon-containing oxide, and the dielectric layers include a carbon-free oxide.

7. The semiconductor device of claim 1, wherein the first blocking layer includes a high-k material, and wherein the etch stop layer includes a material with a dielectric constant that is lower than a dielectric constant of the first blocking layer.

8. The semiconductor device of claim 1, wherein the first blocking layer includes a metal oxide, and the continuous etch stop layer includes a carbon-containing silicon oxide.

9. The semiconductor device of claim 1, wherein the first blocking layer includes aluminum oxide, and the continuous etch stop layer includes SiCO.

10. The semiconductor device of claim 1, wherein the conductive layers and the dielectric layers are in direct contact, and the conductive layers and the dielectric layers have a blocking layer-free structure.

11. The semiconductor device of claim 1, further comprising:

a charge trapping layer disposed between the second blocking layer and the channel layer, and a tunnel dielectric layer disposed between the charge trapping layer and the channel layer.

12. The semiconductor device of claim 1, wherein the first blocking layer includes a high-k material, and wherein the second blocking layer and the continuous etch stop layer include a material with a dielectric constant that is lower than a dielectric constant of the first blocking layer.

13. The semiconductor device of claim 1, wherein a thickness of the first blocking layer is thinner than a thickness of the second blocking layer.

* * * * *